US011468850B2

(12) United States Patent
Tang et al.

(10) Patent No.: US 11,468,850 B2
(45) Date of Patent: Oct. 11, 2022

(54) COMPENSATION APPARATUS AND METHOD OF LIGHT-EMITTING DEVICE, DISPLAY DEVICE, DISPLAY SUBSTRATE AND FABRICATION METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guoqiang Tang, Beijing (CN); Yingsong Xu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 310 days.

(21) Appl. No.: 16/605,616

(22) PCT Filed: Mar. 20, 2019

(86) PCT No.: PCT/CN2019/078888
§ 371 (c)(1),
(2) Date: Oct. 16, 2019

(87) PCT Pub. No.: WO2020/001088
PCT Pub. Date: Jan. 2, 2020

(65) Prior Publication Data
US 2021/0407435 A1 Dec. 30, 2021

(30) Foreign Application Priority Data

Jun. 26, 2018 (CN) .......................... 201810673760.7

(51) Int. Cl.
*G09G 3/32* (2016.01)
*G09G 3/3291* (2016.01)
*H01L 27/32* (2006.01)

(52) U.S. Cl.
CPC ....... *G09G 3/3291* (2013.01); *H01L 27/3269* (2013.01); *G09G 2320/045* (2013.01); *G09G 2360/142* (2013.01); *G09G 2360/148* (2013.01)

(58) Field of Classification Search
CPC ....... G09G 2360/148; G09G 2360/142; G09G 2320/045; G09G 3/3291; H01L 27/3269
See application file for complete search history.

(56) References Cited

U.S. PATENT DOCUMENTS

| | | | |
|---|---|---|---|
| 8,199,074 | B2 | 6/2012 | Wang et al. |
| 2005/0104821 | A1 | 5/2005 | Doe |

(Continued)

FOREIGN PATENT DOCUMENTS

| | | |
|---|---|---|
| CN | 1734541 A | 2/2006 |
| CN | 101101728 A | 1/2008 |

(Continued)

OTHER PUBLICATIONS

First Chinese Office Action dated May 7, 2020.

*Primary Examiner* — Towfiq Elahi
(74) *Attorney, Agent, or Firm* — Dilworth & Barrese, LLP.; Michael J. Musella, Esq.

(57) ABSTRACT

The present disclosure provides a compensation apparatus and method of a light-emitting device and display substrate and fabrication method thereof. The apparatus of light-emitting device includes a light sensing circuit and a compensation amount computing circuit. The light sensing circuit is configured to output a first photo-generated current under a condition that the light-emitting device emits light, when the light-emitting device needs to be compensated.

(Continued)

The compensation amount computing circuit is connected with the light sensing circuit, and configured to compute a compensation amount required to compensate the light-emitting device according to the first photo-generated current.

16 Claims, 10 Drawing Sheets

(56) References Cited

U.S. PATENT DOCUMENTS

| | | |
|---|---|---|
| 2006/0012311 A1 | 1/2006 | Ogawa |
| 2006/0017871 A1* | 1/2006 | Morimoto ......... G02F 1/133555 349/114 |
| 2008/0036703 A1* | 2/2008 | Wang ..................... G09G 3/006 345/76 |
| 2008/0231558 A1 | 9/2008 | Naugler |
| 2010/0053045 A1 | 3/2010 | Fish et al. |
| 2010/0085340 A1 | 4/2010 | Omoto et al. |
| 2010/0177075 A1 | 7/2010 | Fish et al. |
| 2010/0201275 A1 | 8/2010 | Cok et al. |
| 2011/0074750 A1 | 3/2011 | Leon et al. |
| 2015/0061977 A1 | 3/2015 | Mccartney |
| 2018/0173349 A1* | 6/2018 | Cho .................... H01L 27/3269 |

FOREIGN PATENT DOCUMENTS

| | | |
|---|---|---|
| CN | 101123066 A | 2/2008 |
| CN | 101208735 A | 6/2008 |
| CN | 101542571 A | 9/2009 |
| CN | 101714327 A | 5/2010 |
| CN | 102034427 A | 4/2011 |
| CN | 102376245 A | 3/2012 |
| CN | 102379002 A | 3/2012 |
| CN | 102687193 A | 9/2012 |
| CN | 103280181 A | 9/2013 |
| CN | 105741771 A | 7/2016 |
| CN | 107464529 A | 12/2017 |

* cited by examiner

COMPENSATION APPARATUS AND METHOD OF LIGHT-EMITTING DEVICE, DISPLAY DEVICE, DISPLAY SUBSTRATE AND FABRICATION METHOD THEREOF

The present application is based on PCT/CN2019/078888, filed in Mar. 20, 2019, which claims priority of Chinese Patent Application No. 201810673760.7 filed on Jun. 26, 2018, the disclosure of which is incorporated herein by reference in its entirety as part of the present application.

TECHNICAL FIELD

Some embodiments of the present disclosure relate to a compensation apparatus and method of a light-emitting device, a display device, a display substrate and a fabrication method thereof.

BACKGROUND

Organic Light-Emitting Diode (OLED) display devices are getting more and more attention and favor from the display industry due to characteristics such as self-illumination, high contrast, high color gamut, wide viewing angle, thinness and lightness, as well as compatibility and flexibility.

A sub-pixel in the OLED display device implements gray scale display by luminance of light emitted by a corresponding OLED light-emitting device. Due to factors such as intrinsic material properties of a light-emitting material inside the OLED light-emitting device and staying in a working condition for a long time, the OLED light-emitting device will have different degrees of aging problems as the use time increases; and the aging problem mainly manifests as: under a same working voltage, light emission luminance of the aged OLED light-emitting device is weaker than that of the unaged OLED light-emitting device.

SUMMARY

According to at least one embodiment of the present disclosure, a compensation apparatus of a light-emitting device is disclosed, comprising: a light sensing circuit, configured to output a first photo-generated current under a condition that the light-emitting device emits light, when the light-emitting device needs to be compensated; and a compensation amount computing circuit, connected with the light sensing circuit, and configured to compute a compensation amount required to compensate the light-emitting device according to the first photo-generated current.

For example, in the compensation apparatus of the light-emitting device according to some embodiments, the light sensing circuit includes: a photodetection field effect transistor. The photodetection field effect transistor has a control terminal connected with an optical sensing control signal terminal, an input terminal connected with a power supply voltage signal terminal, and an output terminal connected with the compensation amount computing circuit.

For example, in the compensation apparatus of the light-emitting device according to some embodiments, the light sensing circuit is further configured to output a ground state current under a condition that the light-emitting device does not emit light, when the light-emitting device needs to be compensated. The compensation amount computing circuit includes: a photo-generated current calibration circuit, connected with the light sensing circuit, and configured to calibrate the first photo-generated current by using the ground state current, to obtain a second photo-generated current; a memory, stored with a $V_{data}$-$I_{ini}$ curve of the light-emitting device; where, $V_{data}$ is a data voltage when the light-emitting device is unaged, $I_{ini}$ is a photo-generated current generated by the light sensing circuit as sensing luminance under $V_{data}$ when the light-emitting device is unaged; and a computing unit, connected with the photo-generated current calibration circuit and the memory, and configured to look up a corresponding data voltage when $I_{ini}$ is equal to the second photo-generated current, and acquire a data voltage of the light-emitting device at a current moment, from the $V_{data}$-$I_{ini}$ curves stored in the memory, according to the second photo-generated current, and compute to obtain the compensation amount required to compensate for the data voltage of the light-emitting device.

For example, in the compensation apparatus of the light-emitting device according to some embodiments, the photo-generated current calibration circuit includes: a sample circuit, connected with the light sensing circuit, and configured to sample respectively with the ground state current and the first photo-generated current as input signals; and a calibrating sub-unit, connected with the sample circuit and the computing unit, and configured to perform calibration computation on a sampling result of the sample circuit, to obtain the second photo-generated current.

For example, in the compensation apparatus of the light-emitting device according to some embodiments, the sample circuit includes: an integrating capacitor, having a first terminal connected with the light sensing circuit, and a second terminal connected with the computing unit; an amplifier, having an inverting terminal connected with the light sensing circuit, and an output terminal connected with the computing unit; a first variable acquisition switch, having a control terminal connected with a sampling control signal terminal, an input terminal connected with the inverting terminal of the amplifier, and an output terminal connected with the output terminal of the amplifier; a second variable acquisition switch, having a control terminal connected with the sampling control signal terminal, an input terminal connected with the inverting terminal of the amplifier, and an output terminal connected with a non-inverting terminal of the amplifier; a storage capacitor, having a first terminal connected with the output terminal of the second variable acquisition switch, and a second terminal connected with a low potential signal terminal; and a reference resistor, electrically connected with the light sensing circuit and the inverting terminal of the amplifier.

For example, in the compensation apparatus of the light-emitting device according to some embodiments, the memory is stored with respective $V_{data}$-$I_{ini}$ curves of light-emitting devices that emit light of different colors; with respect to a light-emitting device that emit light of a certain color, there are a plurality of $V_{data}$-$I_{ini}$ curves, and the plurality of $V_{data}$-$I_{ini}$ curves are $V_{data}$-$I_{ini}$ curves established with respect to different ambient light conditions.

For example, in the compensation apparatus of the light-emitting device according to some embodiments, the compensation apparatus further comprises: a processor, connected with the light sensing circuit and the compensation amount computing circuit, and configured to determine an opportunity to compensate the light-emitting device according to a setting rule, and correspondingly control the light sensing circuit and the compensation amount computing circuit to execute the compensation task; a data voltage generating circuit, connected with the processor, and configured to sum up the data voltage of the light-emitting device at the current moment and the compensation amount computed by the compensation amount computing circuit, to obtain the compensated data voltage and output.

According to at least one embodiment of the present disclosure, a compensation method of a light-emitting device is provided. The method is used for driving the compensation apparatus of the light-emitting device according to any embodiment of the present disclosure. The compensation method comprises: when the light-emitting device in a display device needs to be compensated, turning on a light sensing circuit in the compensation apparatus, under a condition that the light-emitting device emits light, so that the light sensing circuit outputs a first photo-generated current; and computing a compensation amount required to compensate the light-emitting device according to the first photo-generated current.

For example, in the compensation method according to some embodiments, before the turning on a light sensing circuit in the compensation apparatus, under a condition that the light-emitting device emits light, so that the light sensing circuit outputs a first photo-generated current, the method further comprises: turning on the light sensing circuit, under a condition that the light-emitting device does not emit light, so that the light sensing circuit outputs a ground state current; the computing a compensation amount required to compensate the light-emitting device according to the first photo-generated current, includes: calibrating the first photo-generated current by using the ground state current, to obtain a second photo-generated current $I_{ph}'$; looking up from a $V_{data}-I_{ini}$ of the light-emitting device a corresponding data voltage $V_{data}$ when $I_{ini}$ is equal to the second photo-generated current $I_{ph}'$, according to the second photo-generated current $I_{ph}'$; where, $V_{data}$ is the data voltage when the light-emitting device is unaged, and $I_{ini}$ is the photo-generated current generated by the light sensing circuit as sensing luminance under $V_{data}$ when the light-emitting device is unaged; acquiring a data voltage $V_{data}'$ of the light-emitting device at the current moment; and computing to obtain a compensation amount $\Delta V_{data}$ required to compensate for the data voltage of the light-emitting device by using Formula (1): $\Delta V_{data}=|V_{data}'-V_{data}|$ (1).

For example, in the compensation method according to some embodiments, the calibrating the first photo-generated current by using the ground state current, to obtain a second photo-generated current $I_{ph}'$, includes: sampling with the ground state current as an input signal, and expressing an output signal $V_{out1}$ after the sampling by using Formula (2):

$$V_{out1} = \frac{1}{C}\int_0^\tau I_0(t)dt, \quad (2)$$

where $I_0$ is the ground state current; C is a capacitance value of a storage capacitor in the compensation apparatus; and t is time for sampling with the ground state current $I_0$ as the input signal; sampling with the first photo-generated current as an input signal, and expressing an output signal $V_{out2}$ after the sampling by using Formula (3):

$$V_{out2} = V_{out1} - \frac{1}{C}\int_0^\tau I_{ph}(t)dt, \quad (3)$$

where $I_{ph}'$ is the first photo-generated current; C is a capacitance value of an integrating capacitor in the compensation apparatus, which is equal to the capacitance value of the storage capacitor in the compensation apparatus; t is time for sampling with the first photo-generated current $I_{ph}$ as the input signal, and is equal to the time for sampling with the ground state current $I_0$ as the input signal; performing calibration computation by using Formula (4) below to obtain the second photo-generated current $I_{ph}'$: $\int_0^\tau I_{ph}'(t)dt=-V_{out2}C$ (4).

For example, in the compensation method according to some embodiments, the compensation method further comprises: establishing the $V_{data}-I_{ini}$ curve of the light-emitting device, the establishing the $V_{data}-I_{ini}$ curve of the light-emitting device, includes: performing an optical sensing test on the light sensing circuit, to acquire at least two groups of test data $(I_{ph,test}, P_{opt})$, where, $I_{ph,test}$ is the photo-generated current generated by the light sensing circuit as sensing optical power $P_{opt}$; judging whether the at least two groups of test data $(I_{ph,test}, P_{opt})$ meet Formula (5) or meet Formula (6): $I_{ph,test}=A \cdot P_{opt}$ (5), where, A is a first proportional coefficient;

$$I_{ph,test} = \frac{BkT}{q}\ln\left(1 + \frac{\eta q \lambda P_{opt}}{I_{pd}\, hc}\right)$$

(6), where B is a second proportional coefficient; k is a Boltzmann constant; T is the absolute temperature; q is an electron charge; η is a photoelectric conversion quantum efficiency; hc/λ is photon energy; and $I_{pd}$ is a minority dark current; if Formula (5) is met, performing function fitting once on $V_{data}$ and $I_{ini}$ in the $V_{data}-I_{ini}$ curve to be established, to establish the $V_{data}-I_{ini}$ curve; if Formula (6) is met, performing exponential function fitting on $V_{data}$ and $I_{ini}$ in the $V_{data}-I_{ini}$ curve to be established, to establish the $V_{data}-I_{ini}$ curve.

For example, in the compensation method according to some embodiments, the compensation method further comprises: establishing the $V_{data}-I_{ini}$ curve of the light-emitting device, the establishing the $V_{data}-I_{ini}$ curve of the light-emitting device includes: respectively establishing $V_{data}-I_{ini}$ curves with respect to light-emitting devices that emit light of different colors; respectively establishing $V_{data}-I_{ini}$ curves under different ambient light conditions with respect to a light-emitting device that emit light of a certain color; before the looking up from a $V_{data}-I_{ini}$ curve of the light-emitting device a corresponding data voltage $V_{data}$ when $I_{ini}$ is equal to the second photo-generated current $I_{ph}'$, according to the second photo-generated current $I_{ph}'$, the compensation method further comprises: determining a color of light emitted by the light-emitting device, acquiring external ambient light luminance at the current moment, and selecting a $V_{data}-I_{ini}$ curve of the light-emitting device at the current moment according thereto.

For example, in the compensation method according to some embodiments, after the computing a compensation amount required to compensate the light-emitting device according to the first photo-generated current, the compensation method further comprises: summing up the data voltage of the light-emitting device at the current moment and the computed compensation amount, to obtain the compensated data voltage and output; determining an opportunity to compensate the light-emitting device according to a setting rule, and compensate the light-emitting device at a corresponding opportunity, wherein the setting rule is compensating the light-emitting device for every time interval.

According to at least one embodiment of the present disclosure, a display device is provided, comprising a light-emitting device, a pixel circuit, and the compensation apparatus of the light-emitting device according to any embodiment of the present disclosure, wherein the compensation apparatus is configured to supply the pixel circuit with a compensation amount required to compensate the light-emitting device.

According to at least one embodiment of the present disclosure, a display substrate is provided, comprising a light-emitting device and a light sensing circuit, the light sensing circuit being provided corresponding to the light-emitting device and configured to output a first photo-generated current under a condition that a light-emitting device corresponding thereto emits light, when the light-emitting device corresponding thereto needs to be compensated.

For example, in the display substrate according to some embodiments, the light sensing circuit is located on a side of the light-emitting device corresponding thereto that faces the base substrate of the display substrate; the light-emitting device sequentially includes: a first electrode, a light-emitting layer and a second electrode in a direction perpendicular to the base substrate and directing from the base substrate toward the light-emitting device; and the first electrode is light transmissive, and the second electrode is light reflective.

For example, in the display substrate according to some embodiments, an orthogonal projection of the light sensing circuit on the base substrate is located within a range of an orthogonal projection of the light-emitting device corresponding to the light sensing circuit on the base substrate.

For example, in the display substrate according to some embodiments, the light sensing circuit includes a photodetection field effect transistor, and the photodetection field effect transistor includes: a first gate electrode, a first active layer, a first source electrode and a first drain electrode; the first electrode of the light-emitting device sequentially includes: a first transparent conductive layer, a metal conductive layer and a second transparent conductive layer; the metal conductive layer has a blind hole on a side facing away from the base substrate, a position of the blind hole corresponds to a region of the first active layer between the first source electrode and the first drain electrode, and the light-emitting layer is at least partially located in the blind hole.

For example, in the display substrate according to some embodiments, the light sensing circuit includes a photodetection field effect transistor, and the photodetection field effect transistor includes: a first gate electrode, a first active layer, a first source electrode and a first drain electrode; the first electrode of the light-emitting device sequentially includes: a first transparent conductive layer, a metal conductive layer and a second transparent conductive layer; the metal conductive layer has a via hole therein, the first transparent conductive layer and the second transparent conductive layer are in communication with each other through the via hole, and a position of the via hole corresponds to the region of the first active layer between the first source electrode and the first drain electrode.

For example, in the display substrate according to some embodiments, the display substrate further comprises a passivation layer located between the photodetection field effect transistor and the light-emitting device; the passivation layer is provided therein with a microlens, a position of the microlens corresponds to the region of the first active layer between the first source electrode and the first drain electrode, to converge light incident through the via hole to the region of the first active layer between the first source electrode and the first drain electrode.

For example, in the display substrate according to some embodiments, an orthogonal projection of the light sensing circuit on the base substrate does not overlap or partially overlap with an orthogonal projection of the light-emitting device corresponding to the light sensing circuit on the base substrate; the display substrate further comprises a drive transistor; the drive transistor is provided corresponding to the light-emitting device; and an orthogonal projection of the light sensing circuit on the base substrate and an orthogonal projection of the drive transistor corresponding to the light-emitting device that corresponds to the light sensing circuit on the base substrate are respectively located on both sides of the orthogonal projection of the light-emitting device corresponding to the light sensing circuit on the base substrate.

For example, in the display substrate according to some embodiments, the light sensing circuit includes a photodetection field effect transistor, and the photodetection field effect transistor includes: a first gate electrode, a first active layer, a first source electrode and a first drain electrode; the display substrate further comprises a pixel defining layer, the light-emitting layer is located within a pixel region defined by the pixel defining layer, the pixel defining layer has a protrusion on a side facing away from the base substrate, the second electrode is formed with a groove whose opening faces the base substrate at the position of the protrusion, and an orthogonal projection of the groove on the base substrate does not overlap with an orthogonal projection of the light-emitting layer on the base substrate, so that the groove can reflect light emitted by the light-emitting layer to the region of the first active layer between the first source electrode and the first drain electrode.

For example, in the display substrate according to some embodiments, the light sensing circuit includes a photodetection field effect transistor, and the photodetection field effect transistor includes: a first gate electrode, a first active layer, a first source electrode and a first drain electrode; the display substrate further comprises a drive transistor, and the drive transistor includes: a second gate electrode, a second active layer, a second source electrode and a second drain electrode; the first gate electrode and the second gate electrode are located in a same film layer; the first source electrode and the first drain electrode are located in a same film layer as the second source electrode and the second drain electrode.

For example, in the display substrate according to some embodiments, the display substrate comprises a plurality of compensation regions, each compensation region in the plurality of compensation regions includes a plurality of light-emitting devices that emit light of different colors, and at least one light-emitting device of the plurality of light-emitting devices is correspondingly provided with the light sensing circuit.

For example, in the display substrate according to some embodiments, the display substrate further comprises: a driver line, correspondingly connected with the light sensing circuit, and configured to input an optical sensing control signal Ctr2 to the corresponding light sensing circuit, to control operation of the corresponding light sensing circuit; a sensor line, correspondingly connected with the light sensing circuit, and configured to transmit a current signal output by the corresponding light sensing circuit to a driving chip bound to the display substrate; a gate line, parallel to the driver line and located in a same film layer as the driver line; and a data line, parallel to the sensor line and located in a same film layer as the sensor line.

According to at least one embodiment, a fabrication method of a display substrate is provided, comprising fabricating a light-emitting device, and further comprising: before the fabricating a light-emitting device, fabricating a light sensing circuit, wherein, the light sensing circuit is provided corresponding to the light-emitting device, and the light sensing circuit is configured to output a first photogenerated current under a condition that a light-emitting device corresponding thereto emits light, when the light-emitting device corresponding thereto needs to be compensated; the light sensing circuit includes a photodetection field effect transistor, and the photodetection field effect transistor includes: a first gate electrode, a first active layer, a first source electrode and a first drain electrode; and before the fabricating a light-emitting device, further comprising: fabricating a drive transistor, the drive transistor including: a second gate electrode, a second active layer, a second source electrode and a second drain electrode; wherein, the first gate electrode and the second gate electrode are fabricated by using a same step; and the first source electrode and the first drain electrode are fabricated by using a same step as the second source electrode and the second drain electrode.

According to at least one embodiment of the present disclosure, a display device is provided, comprising the display substrate according to any embodiment of the present disclosure.

BRIEF DESCRIPTION OF THE DRAWINGS

In order to clearly illustrate the technical solution of the embodiments the present disclosure or in the prior art, the drawings to be used in description of the embodiments or the prior art will be briefly described in the following; it is obvious that the described drawings are only related to some embodiments of the present disclosure. Based on the drawings, those ordinarily skilled in the art can obtain other drawings, without any inventive work.

DETAILED DESCRIPTION

Figure 1:
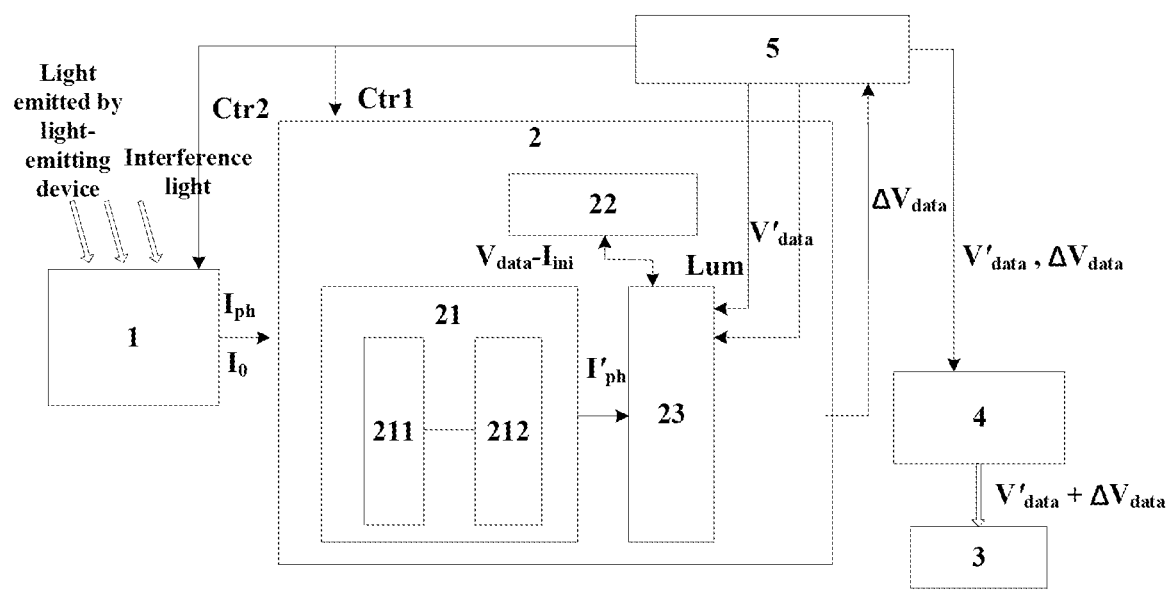
FIG. 1 is a structural schematic diagram of a compensation apparatus of a light-emitting device provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the absolute position of the object which is described is changed, the relative position relationship may be changed accordingly.

Hereinafter, the present disclosure will be described with reference to some particular embodiments. For the purpose of clarity and clearness, detailed descriptions about commonly known elements will be omitted. Same or similar reference numerals will be used for the same element shown in one or more figures throughout the drawings.

A light-emitting device in an OLED display device may be aged as the use time increases, and in order to ensure display quality of the OLED display device, it is necessary to compensate the aged light-emitting device thereof.

Compensation is generally performed with respect to a voltage or current of the light-emitting device, and a voltage or current value is increased to make the aged light-emitting device to reach luminance similar to or the same as that of an unaged condition. With respect to computation of a compensation amount (i.e., a value by which the voltage or the current is increased), it is mainly practiced in a related art to simulate a scene of using the light-emitting device through a test, so as to predict an aging law of the light-emitting device, and establish a service life model of the light-emitting device, thereby determining an amount of compensation required according to the established service life model during actual compensation.

However, a situation of the light-emitting device is ever-changing in actual use, and luminance of the light-emitting device is constantly changing during use, so it is impossible to exhaust all the scenes of using the light-emitting device by simulation through limited number of tests, and the predicted aging law can be as accurate as possible only by increasing the number of simulated scenes, and simulating a common scene, which, however, requires to collect a large amount of test data in advance, and to perform a large number of computations; moreover, there is an unpredictable difference between the simulated scene in the test based on which the aging law is predicted and an actual use scene, so accuracy of the predicted aging law and the service life model established according thereto is not high, resulting in relatively low accuracy of the obtained compensation amount data, which cannot implement effective compensation.

At least one embodiment of the present disclosure provides a compensation apparatus of a light-emitting device, comprising: a light sensing circuit and a compensation amount computing circuit. The light sensing circuit is configured to output a first photo-generated current under a condition that the light-emitting device emits light, when the light-emitting device needs to be compensated; the compensation amount computing circuit is connected with the light sensing circuit, and is configured to acquire a data voltage when the light-emitting device is unaged, according to the first photo-generated current, to compute a compensation amount required to compensate the light-emitting device. At least one embodiment of the present disclosure further provides a compensation method corresponding to the above-described compensation apparatus, a display device and a display substrate.

In the compensation apparatus provided by the above-described embodiment of the present disclosure, by providing the light sensing circuit beside the light-emitting device of the display device, and in a compensation process, using the light sensing circuit to sense luminance of the light-emitting device and generate the photo-generated current, and determining an aging degree of the light-emitting device according to the photo-generated current, the compensation amount required by the light-emitting device is determined, to implement compensation for the light-emitting device.

In the above-described technical solution proposed by the present disclosure, the data according to which the aging degree of the light-emitting device is determined is the photo-generated current actually generated by the light sensing circuit as sensing the luminance of the light-emitting device in the compensation process, and the three factors of the luminance of the light-emitting device, the photo-generated current generated by the light sensing circuit, and the aging degree of the light-emitting device have a certain relationship therebetween, so the determined aging degree just represents an actual aging degree of the light-emitting device at present, other than an aging degree predicted in advance, so that the computed compensation amount data is more accurate, and effective compensation of the light-emitting device can be implemented. Moreover, compensation is implemented without collecting a large amount of test data, or establishing a complicated service life model of the light-emitting device, and thus, a computation amount is relatively small.

Some embodiments of the present disclosure are described with an OLED display device as an application scenario; the display device mainly comprises an OLED display panel for displaying a picture, and a driving chip connected with the OLED display panel and configured to drive the OLED display panel to display. For example, each sub-pixel in the OLED display panel is correspondingly provided with an OLED light-emitting device, and a color of a sub-pixel depends on a color of light emitted by an OLED light-emitting device corresponding thereto. For example, an OLED display panel for trichromatic full-color display may include sub-pixels of three colors of red (R), green (G) and blue (B), and correspondingly, include three types of OLED light-emitting devices that emit red light, green light and blue light; for example, the OLED light-emitting device may further emit white light or the like, which will not be limited in the embodiment of the present disclosure. It should be noted that the embodiment of the present disclosure is merely described with the above-described application scenario as an example, and in other embodiment of the present disclosure, there may be other application scenario, for example, a quantum dot light-emitting diode (QLED) display panel, which will not be limited in the embodiment of the present disclosure.

Referring to FIG. 1, some embodiments of the present disclosure provide a compensation apparatus of a light-emitting device, the compensation apparatus comprising a light sensing circuit 1, and a compensation amount computing circuit 2 connected with the light sensing circuit 1. For example, the light sensing circuit 1 outputs a first photo-generated current $I_{ph}$ under a condition that a light-emitting device 3 emits light, when the light-emitting device 3 needs to be compensated. The light sensing circuit 1 may be provided in a display panel of a display device at a position close to the light-emitting device 3 to be compensated, in order to accurately receive and sense light emitted by the light-emitting device 3. The compensation amount computing circuit 2 computes a compensation amount $\Delta V_{data}$ required to compensate the light-emitting device 3 according to the first photo-generated current $I_{ph}$ output by the light sensing circuit 1. The compensation amount computing circuit 2 may be integrated in a driving chip of the display device.

Figure 2:
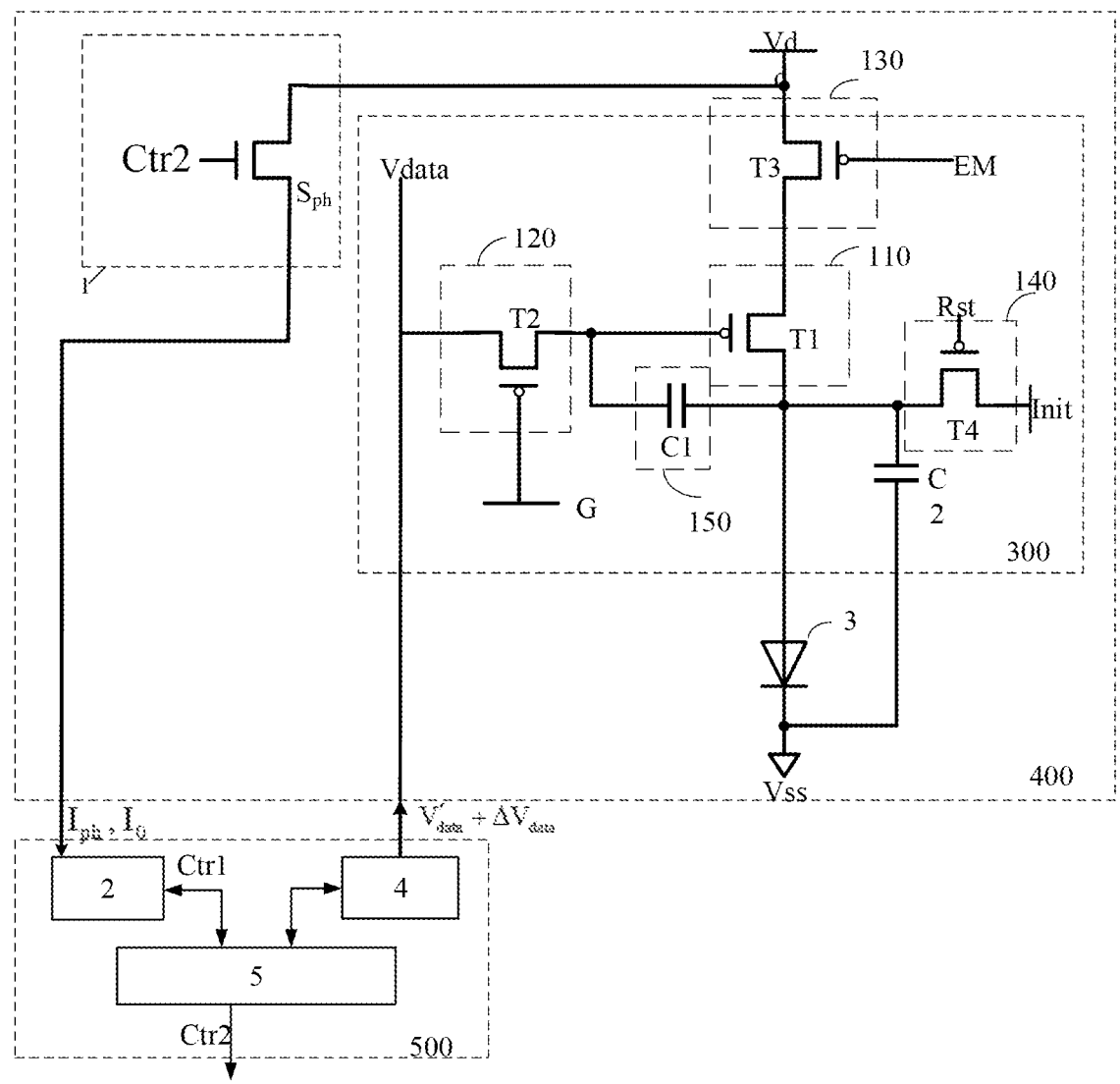
FIG. 2 is a schematic diagram of a display device provided by some embodiments of the present disclosure.

FIG. 2 is a schematic diagram of a display device provided by some embodiments of the present disclosure. Referring to FIG. 2, in an example, a light sensing circuit 1 may include a photodetection field effect transistor $S_{ph}$, the photodetection field effect transistor $S_{ph}$ has a control terminal to receive an optical sensing control signal Ctr2, an input terminal connected with a power supply voltage signal Vdd terminal, and an output terminal connected with the compensation amount computing circuit 2. For example, the optical sensing control signal Ctr2 may be generated by a driving chip 500 (which may specifically be a processor 5 in the driving chip 500) or an external circuit of other display panel, the power supply voltage signal Vdd may share a same power supply voltage signal with a pixel circuit 300 of a display panel 400, and the compensation amount computing circuit 2 may be integrated in the driving chip 500. When the optical sensing control signal Ctr2 controls the photo-detection field effect transistor $S_{ph}$ to be turned on, if the light-emitting device is in a light-emitting state at this time, then the photodetection field effect transistor $S_{ph}$ senses the luminance of the light-emitting device to generate a current signal, and outputs a first photo-generated current $I_{ph}$.

It should be noted that the pixel circuit 300 shown in FIG. 2 has a 4T2C structure (i.e., 4 thin film transistors and 2 capacitors); two output terminals of the pixel circuit 300 are respectively connected with an anode and a cathode of the light-emitting device; and the cathode of the light-emitting device is further connected with a low potential signal Vss terminal, wherein, G is a gate drive signal, EM is a light emission control signal, Rst is a reset signal, and Vdata is a data signal.

As shown in FIG. 2, the pixel circuit 300 includes a drive circuit 110, a data write circuit 120, a light emission control circuit 130, a reset circuit 140 and a storage circuit 150. The pixel circuit 300 is configured, for example, to provide a drive current that drives the light-emitting device to emit light.

For example, the drive circuit 110 is configured to control the drive current that drives the light-emitting device to emit light. A control terminal of the drive circuit 110 is connected with the data write circuit 120, a first terminal of the drive circuit 110 is connected with a first voltage terminal Vdd (for example, a high level) to receive a first voltage signal, and a second terminal of the drive circuit 110 is connected with the light-emitting device. For example, during operation, the drive circuit 110 may supply the drive current to the light-emitting device to drive the light-emitting device to emit light, and enable the light-emitting device to emit light according to a desired "gray scale".

For example, the data write circuit 120 is connected with the control terminal of the drive circuit 110, and is configured to write a data signal into the control terminal of the drive circuit 110 in response to the gate drive signal. For example, the data write circuit 120 is respectively connected with a data line Vdata, the control terminal of the drive circuit 110, and a gate line G. For example, the gate drive signal from the gate line G is applied to the data write circuit 120 to control ON or OFF of the data write circuit 120. For example, in a data writing stage, the data write circuit 120 may be turned on in response to the gate drive signal, so that the data signal can be written into the control terminal of the drive circuit 110, and then the data signal can be stored in the storage circuit 150. The stored data signal will be used to control an ON degree of the drive circuit 110, so as to control generation of the drive current that drives the light-emitting device to emit light. For example, the data write circuit 120 may be connected with a data signal generating module 4 in the compensation apparatus through the data line Vdata to receive the compensated data voltage, that is, the data signal is the compensated data voltage generated by the compensation apparatus, so that the light-emitting device can be compensated for light emission.

For example, the light emission control circuit 130 is connected with the first terminal of the drive circuit 110 and the first voltage terminal Vdd, and is configured to apply a first voltage of the first voltage terminal Vdd to the first terminal of the drive circuit 110 in response to the light emission control signal EM. For example, as shown in FIG. 2, in a light emission stage, the light emission control circuit 130 may be turned on in response to the light emission control signal EM, so that the first voltage Vdd may be applied to the first terminal of the drive circuit 110. When the drive circuit 110 is turned on, the drive circuit 110 applies the first voltage Vdd to the light-emitting device to supply a drive voltage, so as to drive the light-emitting device to emit light.

For example, the reset circuit 140 is connected with a reset voltage terminal Init, a reset control line Rst, the second terminal of the drive circuit 110, and the anode of the light-emitting device, and is configured to apply a reset voltage to the anode of light-emitting device in response to a reset signal supplied by the reset control line Rst. For example, in an initialization stage, the reset circuit 140 may be turned on in response to the reset signal, so that the reset voltage may be applied to the anode of the light-emitting device, and a reset operation may be performed on the drive circuit 110, the storage circuit 150 and the light-emitting device to eliminate impact of the previous light emission stage. For example, the reset circuit 140 may be implemented with an N-type transistor.

For example, the storage circuit 150 has a first terminal connected with the control terminal of the drive circuit 110, and a second terminal connected with the second terminal of the drive circuit 110, and is configured to store the data signal written by the data write circuit 120. For example, the storage circuit 150 may store the data signal and enable the stored data signal to control the drive circuit 110.

For example, as shown in FIG. 2, in more detail, the drive circuit 110 may be implemented as a first transistor T1. A gate electrode of the first transistor T1 serves as the control terminal of the drive circuit 110, and is connected with a second electrode of a second transistor T2. A first electrode of the first transistor T1 serves as the first terminal of the drive circuit 110, and is connected with the first voltage terminal Vdd; and a second electrode of the first transistor T1 serves as the second terminal of the drive circuit 110, and is connected with the light-emitting device.

The data write circuit 120 may be implemented as the second transistor T2. A gate electrode of the second transistor T2 is connected with a gate line G to receive the gate drive signal, a first electrode of the second transistor T2 is connected with the data line Vdata to receive the data signal, and the second electrode of the second transistor T2 is connected with the first terminal of the drive circuit 110.

The light emission control circuit 130 may be implemented as a third transistor T3. A gate electrode of the third transistor T3 is connected with a light emission control line EM to receive the light emission control signal, a first electrode of the third transistor T3 is connected with the first voltage terminal Vdd to receive the first voltage, and a second electrode of the third transistor is connected with the first terminal of the first transistor T1.

The reset circuit 140 may be implemented as a fourth transistor T4. A gate electrode of the fourth transistor T4 is connected with the reset control line Rst and configured to receive the reset signal, a first electrode of the fourth transistor T4 is connected with the reset voltage terminal Init to receive the reset voltage, and a second electrode of the fourth transistor T4 is configured to be connected with the anode of the light-emitting device.

The storage circuit 150 may be implemented as a storage capacitor C1. A first electrode of the storage capacitor C1 serves as a first terminal of the storage circuit 150, and is configured to be connected with the gate electrode of the first transistor T1, and a second electrode of the storage capacitor C1 serves as a second terminal of the storage circuit 150, and is connected with the second electrode of the first transistor T1.

In FIG. 2, it is illustrated with a case where four thin film transistors T1 to T4 in the pixel circuit 300 are all Positive channel Metal Oxide Semiconductor (PMOS) field effect transistors as an example. Of course, all the thin film transistors in the pixel circuit 300 may also be Negative channel Metal Oxide Semiconductor (NMOS) field effect transistors, or a blend of PMOS field effect transistors and NMOS field effect transistors, and no details will be repeated in the embodiment of the present disclosure. In addition, the above-described pixel circuit 300 having the 4T2C structure is merely an example, and of course, the pixel circuit 300 may further be any other circuit that can drive the light-emitting device to emit light, for example, a circuit having a structure such as 2T1C, 5T1C and 7T1C.

As shown in FIG. 1 and FIG. 2, in consideration of actual application of the display device, under a condition that the light-emitting device 3 emits light, in the first photo-generated current $I_{ph}$ output by the photodetection field effect transistor $S_{ph}$, one portion is a current generated by the photodetection field effect transistor $S_{ph}$ as sensing luminance of the light-emitting device 3, one portion is a current generated by the photodetection field effect transistor $S_{ph}$ as sensing luminance of external interference light (including external ambient light of the display panel 400, and light emitted by light-emitting devices of other surrounding sub-pixels, etc.), and still one portion is an internal leakage current of the photodetection field effect transistor $S_{ph}$ in a dark state. For example, the current generated by the photodetection field effect transistor $S_{ph}$ as sensing the luminance of external interference light of the display panel 400 and the internal leakage current of the photodetection field effect transistor $S_{ph}$ in the dark state may be combined to be referred to as a ground state current $I_0$.

The current generated by the photodetection field effect transistor $S_{ph}$ as sensing the luminance of the light-emitting device 3 is data actually needed for subsequent computation of the compensation amount $\Delta V_{data}$, and the presence of the ground state current $I_0$ affects accuracy of a computing result of the compensation amount $V_{data}$, so accuracy of compensation can be improved by eliminating influence of the ground state current $I_0$ factor.

To eliminate the influence of the ground state current factor, it is necessary to obtain a value of the ground state current $I_0$ before computing the compensation amount $\Delta V_{data}$. For this purpose, please refer to a time sequence of the optical sensing control signal Ctr2 in FIG. 4: when the light-emitting device needs to be compensated, the light-emitting device 3 may be kept OFF firstly, that is, under a condition that the light-emitting device 3 does not emit light, the optical sensing control signal Ctr2 is at a high level, so that the photodetection field effect transistor $S_{ph}$ is turned on, the ground state current $I_0$ output by the photodetection field effect transistor $S_{ph}$ can be obtained, and the ground state current $I_0$ includes the leakage current of the photodetection field effect transistor $S_{ph}$ in the dark state and the photo-generated current generated by the photodetection field effect transistor $S_{ph}$ as sensing the luminance of the interference light. Then, the light-emitting device 3 is turned on, that is, under a condition that the light-emitting device 3 emits light, the optical sensing control signal Ctr2 is at a high level, so that the photodetection field effect transistor $S_{ph}$ is turned on, and the first photo-generated current $I_{ph}$ output by the photodetection field effect transistor $S_{ph}$ can be obtained.

Figure 4:
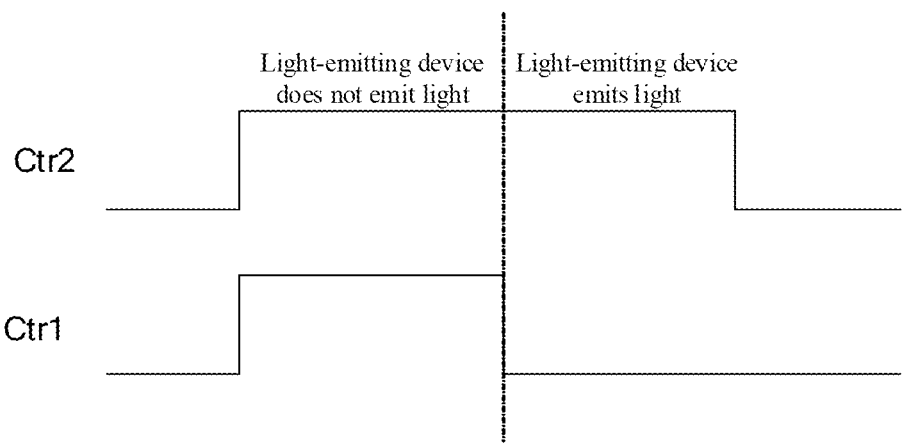
FIG. 4 is a time sequence diagram of the sample circuit provided by some embodiments of the present disclosure.

It should be noted that the time sequence for the optical sensing control signal Ctr2 to control ON and OFF of the photodetection field effect transistor $S_{ph}$ in FIG. 4 is given in the case where the photodetection field effect transistor $S_{ph}$ is an NMOS. Of course, the photodetection field effect transistor $S_{ph}$ may also be a PMOS. For example, in one example, the photodetection field effect transistor $S_{ph}$ has a same type as one or some of the thin film transistors in the pixel circuit 300, which facilitates fabricating the photodetection field effect transistor $S_{ph}$ together with the thin film transistor in the pixel circuit 300, to simplify the fabrication process.

After the ground state current $I_0$ is eliminated from the first photo-generated current $I_{ph}$ the current generated by the photodetection field effect transistor $S_{ph}$ as sensing the luminance of the light-emitting device 3 (hereinafter referred to as a second photo-generated current) is obtained, which, thus, is equivalent to a process of calibrating the first photo-generated current $I_{ph}$.

Referring to FIG. 1 and FIG. 2, in consideration of calibrating the first photo-generated current $I_{ph}$ output by the photodetection field effect transistor $S_{ph}$, the compensation amount computing circuit 2 specifically includes a photo-generated current calibration circuit 21, a memory 22 and a computing unit 23. For example, the computing unit 23 may be implemented by software, hardware (for example, a circuit), or any combination thereof, which will not be limited in the embodiment of the present disclosure.

For example, the photo-generated current calibration circuit 21 is connected with the photodetection field effect transistor $S_{ph}$, and is configured to acquire the ground state current $I_0$ and the first photo-generated current $I_{ph}$ output by the photodetection field effect transistor $S_{ph}$, and calibrate the first photo-generated current $I_{ph}$ by using the ground state current $I_0$, to obtain the second photo-generated current.

In one example, the photo-generated current calibration circuit 21 includes a sample circuit 211 and a calibrating sub-unit 212 connected with the sample circuit 211. For example, the sample circuit 211 is connected with the photodetection field effect transistor $S_{ph}$, and is configured to respectively sample the ground state current $I_0$ and the first photo-generated current $I_{ph}$ output by the photodetection field effect transistor $S_{ph}$, to respectively convert the ground state current $I_0$ and the first photo-generated current $I_{ph}$ into voltage signals and output the voltage signals. The calibrating sub-unit 212 is connected with the sample circuit 211, further connected with the computing unit 23, and is configured to perform calibration computation on the voltage signal converted from the first photo-generated current by using the voltage signal converted from the ground state current, to obtain the second photo-generated current. For example, the calibrating sub-unit 212 may be implemented by software, hardware (for example, a circuit), or any combination thereof, which will not be limited in the embodiment of the present disclosure.

Figure 3:
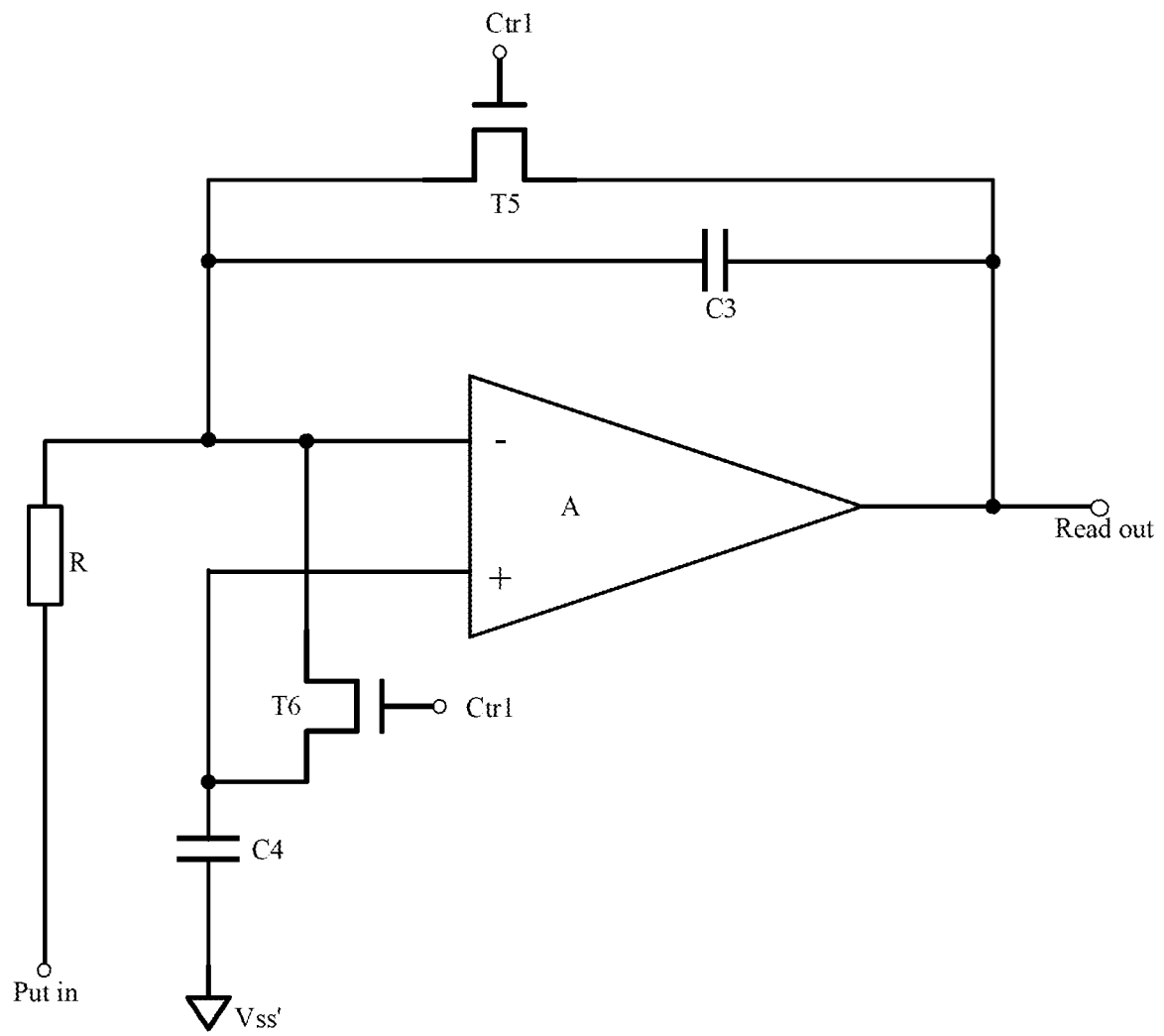
FIG. 3 is a circuit diagram of a sample circuit provided by some embodiments of the present disclosure.

As shown in FIG. 3, with respect to the sample circuit 211, a circuit structure thereof may include: an amplifier A, a first variable acquisition switch T5, a second variable acquisition switch T6, an integrating capacitor C3, and a storage capacitor C4. An inverting terminal of the amplifier A serves as an input terminal Put in of the sample circuit 211, and is connected with the output terminal of the photodetection field effect transistor $S_{ph}$, an output terminal of the amplifier A serves as an output terminal Read out of the sample circuit 211, and is connected with the computing unit 23. The first variable acquisition switch T5 has a control terminal connected with a sampling control signal terminal to receive a sampling control signal Ctr1, an input terminal connected with the inverting terminal of the amplifier A, and an output terminal connected with the output terminal of the amplifier A. The second variable acquisition switch T6 has a control terminal connected with the sampling control signal terminal to receive the sampling control signal Ctr1, an input terminal connected with the inverting terminal of the amplifier A, and an output terminal connected with a non-inverting terminal of the amplifier A. The integrating capacitor C3 has a first terminal connected with the inverting terminal of the amplifier A, and a second terminal connected with the output terminal of the amplifier A. The storage capacitor C4 has a first terminal connected with the output terminal of the second variable acquisition switch T6, and a second terminal connected with a low potential signal terminal Vss'. For example, the sample circuit 211 may further include a reference resistor R which is connected between the output terminal of the photodetection field effect transistor $S_{ph}$ and the inverting terminal of the amplifier A, and stabilizes an electrical performance of the sample circuit 211 by voltage division. It should be noted that the above-described "sampling control signal terminal" is configured to supply the sampling control signal Ctrl, and the sampling control signal Ctrl may be generated by the driving chip 500 (which may specifically be the processor 5 in the driving chip 500) or an external circuit of other display panel.

Based on the above-described structure of the sample circuit 211, referring to the time sequence diagram of the sampling control signal Ctrl in FIG. 4, a working process of the sample circuit 211 is: in a first stage, under the condition that the light-emitting device does not emit light, the sampling control signal Ctrl is at a high level, and controls the first variable acquisition switch T5 and the second variable acquisition switch T6 to be turned on; the input terminal Put in of the sample circuit 211 inputs the ground state current $I_0$ generated by the photodetection field effect transistor $S_{ph}$; a potential of the inverting terminal of the amplifier A is a voltage potential corresponding to the ground state current $I_0$; the storage capacitor C4 is charged so that a potential of the non-inverting terminal of the amplifier A is the voltage potential corresponding to the ground state current $I_0$; the integrating capacitor C3 is not charged; and a potential of the output terminal Read out of the sample circuit 211 is the voltage potential corresponding to the ground state current $I_0$. In a second stage, under the condition that the light-emitting device emits light, the sampling control signal Ctrl is at a low level, and controls the first variable acquisition switch T5 and the second variable acquisition switch T6 to be turned off; the input terminal Put in of the sample circuit 211 inputs the first photo-generated current $I_{ph}$ generated by the photodetection field effect transistor $S_{ph}$; a potential of the inverting terminal of the amplifier A becomes a voltage potential corresponding to the first photo-generated current $I_{ph}$; the integrating capacitor C3 starts to be charged; a potential of the non-inverting terminal of the amplifier A is still the voltage potential corresponding to the ground state current $I_0$; and the potential of the output terminal Read out of the sample circuit 211 is changed from the voltage potential corresponding to the ground state current $I_0$ to a difference between the voltage potential corresponding to the ground state current $I_0$ and the voltage potential corresponding to the first photo-generated current $I_{ph}$.

It should be noted that the above-described working process of the sample circuit 211 is described with a case where both the first variable acquisition switch T5 and the second variable acquisition switch T6 are NMOS as an example. In other embodiment, both T5 and T6 may also be PMOS, or one of them is an NMOS, and the other is a PMOS; and the sampling control signal Ctrl is correspondingly changed according to the types of the first variable acquisition switch T5 and the second variable acquisition switch T6, so long as it is ensured that T5 and T6 are turned on in the first stage (i.e., the light-emitting device does not emit light), and turned off in the second stage (i.e., the light-emitting device emits light), which will not be limited in the embodiment of the present disclosure.

The calibrating sub-unit 212 reads a voltage corresponding to the ground state current $I_0$ from the output terminal Read out of the sample circuit 211 in the first stage, and the voltage may be expressed by using Formula (2) below:

$$V_{out1}=1/C\int_0^t I_0(t)dt \qquad (2)$$

Where $I_0$ represents the ground state current; $V_{out1}$ represents an output signal after sampling with the ground state current $I_0$ as the input signal, that is, the voltage corresponding to the ground state current $I_0$; C is a capacitance value of the storage capacitor C4; t is time for sampling with the ground state current $I_0$ as the input signal, that is, time at which the sampling control signal Ctrl controls T5 and T6 to be turned on.

A voltage read by the calibrating sub-unit 212 from the output terminal Read out of the sample circuit 211 in the second stage is a difference between the voltage corresponding to the ground state current $I_0$ and the voltage corresponding to the first photo-generated current $I_{ph}$, and the voltage may be expressed by using Formula (3) below:

$$V_{out2} = V_{out1} - \frac{1}{C}\int_0^t I_{ph}(t)dt \qquad (3)$$

Where $I_{ph}$ represents the first photo-generated current; $V_{out2}$ represents an output signal after sampling with the first photo-generated current $I_{ph}$ as an input signal, that is, the difference between the voltage corresponding to the ground state current $I_0$ and the voltage corresponding to the first photo-generated current $I_{ph}$; t is time for sampling with the first photo-generated current $I_{ph}$ as the input signal, and the time is equal to the time for sampling with the ground state current $I_0$ as the input signal in the first stage; C is a capacitance value of the integrating capacitor C3, and the capacitance value is equal to the capacitance value of the storage capacitor C4.

The first photo-generated current $I_{ph}$ is a sum of the ground state current $I_0$ and a current $I_{ph}'$ (i.e., the second photo-generated current) generated by the photodetection field effect transistor $S_{ph}$ as sensing the luminance of the light-emitting device, that is, $I_{ph}=I_0+I_{ph}'$, and therefore, the following formula can be further derived from Formula (3):

$$V_{out2} = V_{out1} - \frac{1}{C}\int_0^t [I_0(t) + I_{ph}'(t)]dt =$$

$$V_{out1} - \frac{1}{C}\int_0^t I_0(t)dt - \frac{1}{C}\int_0^t I_{ph}' = -\frac{1}{C}\int_0^t I_{ph}'(t)dt$$

And then, Formula (4) as below is derived:

$$\int_0^t I_{ph}'(t)dt = -V_{out2}C \qquad (4)$$

After the calibrating sub-unit 212 respectively read $V_{out1}$ and $V_{out2}$ from the output terminal Read out of the sample circuit 211, the second photo-generated current $I_{ph}'$ can be computed by using Formula (4) above. It can be known from the above-described computation process that, the current is integrated by time, so that the computed second photo-generated current $I_{ph}'$ is an average value of the current during the sampling time t. External disturbance causes the second photo-generated current $I_{ph}'$ to fluctuate within the sampling time t, for example, a spectrum of light emitted by the light-emitting device will change with time, resulting in that the photo-generated current generated by the photodetection field effect transistor $S_{ph}$ as sensing the luminance of the light-emitting device also changes; and therefore, simply measuring or computing a value of the second photo-generated current $I_{ph}'$ at a certain moment causes accuracy to decrease; however, in this embodiment, the current is integrated by time, and the average value of the second photo-generated current $I_{ph}'$ within the sampling time t is computed, which effectively improves accuracy of computing the second photo-generated current $I_{ph}'$. Since subsequent computation of the compensation amount is based on the value of the second photo-generated current $I_{ph}'$, the above-described method for computing the second photo-generated current $I_{ph}'$ can directly improve accuracy of compensation.

It should be noted that the above-described computation process that can be implemented by the calibrating sub-unit 212 may be configured to be implemented by a computer program, and the computer program may be configured in the driving chip 500 of the display device.

The above is relevant introduction of the photo-generated current calibration circuit 21 in the compensation amount computing circuit 2, and the memory 22 in the compensation amount computing circuit 2 will be described below.

Figure 5:
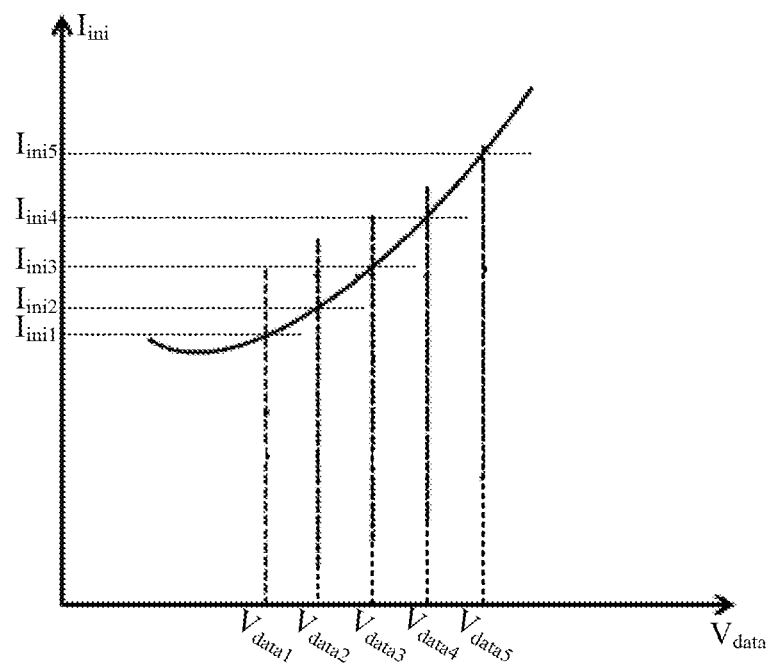
FIG. 5 is a schematic diagram I of a $V_{data}$-$I_{ini}$ curve according to some embodiments of the present disclosure.

As shown in FIG. 5, a $V_{data}$-$I_{ini}$ curve of the light-emitting device 3 is pre-stored in the memory 22. In the $V_{data}$-$I_{ini}$ curve, $V_{data}$ is the data voltage when the light-emitting device 3 is unaged, $I_{ini}$ is the photo-generated current generated by the photodetection field effect transistor $S_{ph}$ as sensing the luminance of the light-emitting device 3 under $V_{data}$.

Figure 6:
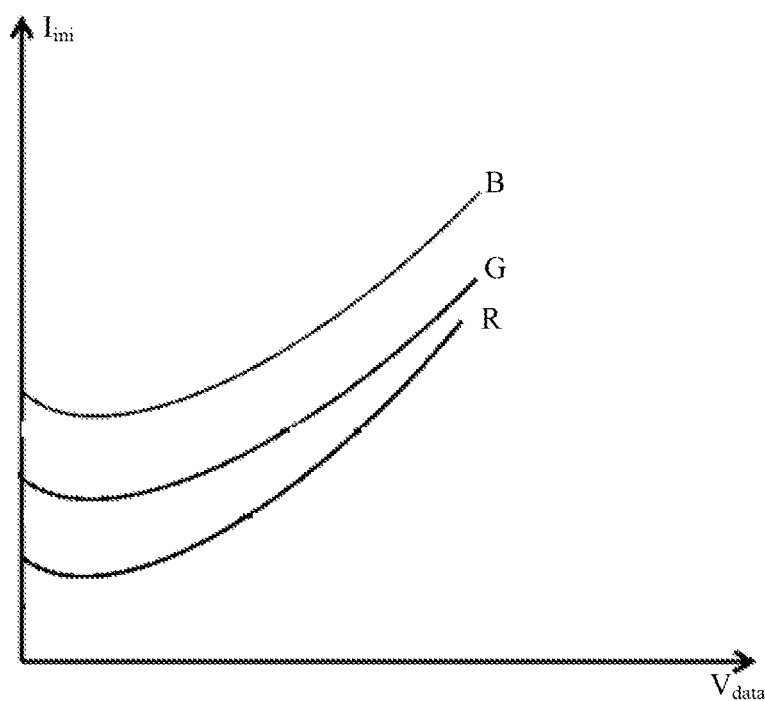
FIG. 6 is a schematic diagram II of a $V_{data}$-$I_{ini}$ curve according to some embodiments of the present disclosure.

The display device comprises light-emitting devices that emit light of different colors, all of which need corresponding compensation, and the photodetection field effect transistor $S_{ph}$ has different responsiveness to light of different colors, so the generated photo-generated currents are different, and it can be seen that $V_{data}$-$I_{ini}$ curves of light-emitting devices that emit light of different colors are different from one another. In order to further improve accuracy of compensation, respective $V_{data}$-$I_{ini}$ curves of the light-emitting devices that emit light of different colors may be pre-stored in the memory 22 (as shown in FIG. 5). As shown in FIG. 6, with respect to the display device comprising light-emitting devices that emit red (R) light, green (G) light and blue (B) light, the memory 22 is stored with their respective $V_{data}$-$I_{ini}$ curves.

Figure 7:
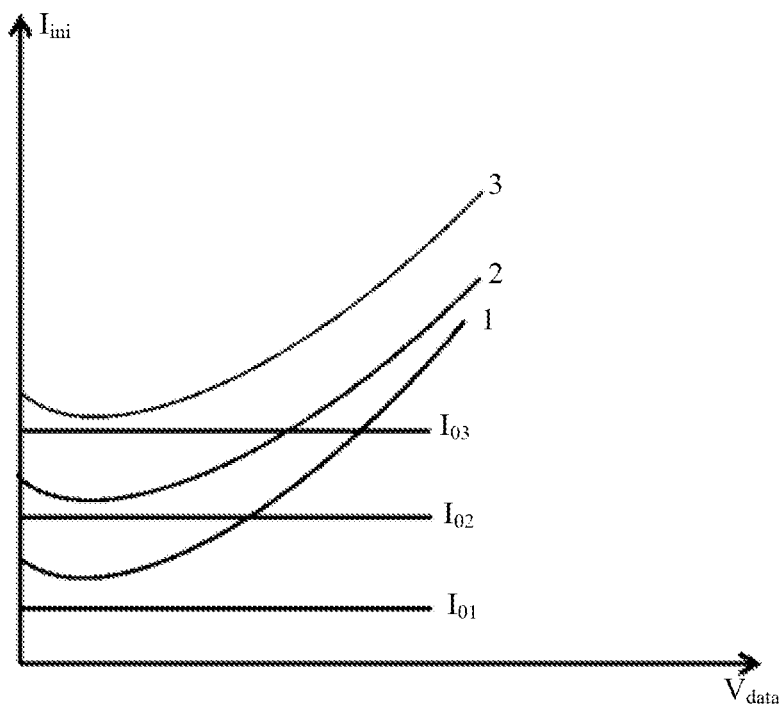
FIG. 7 is a schematic diagram III of a $V_{data}$-$I_{ini}$ curve according to some embodiments of the present disclosure.

In another aspect, since a relationship between the photo-generated current of the photodetection field effect transistor $S_{ph}$ and luminance of light is generally non-linear, that is, under ambient light of different intensities, partial differentials of the photo-generated currents generated by the photodetection field effect transistor $S_{ph}$ as sensing the luminance of the light-emitting device to different luminance of the light-emitting device are different from one another; from another point of view, under ambient light of different intensities, photo-generated currents generated by the photodetection field effect transistor $S_{ph}$ as sensing luminance of a same light-emitting device are different from one another. To address the problem, in order to further improve accuracy of compensation, with respect to each type of light-emitting device (here, light-emitting devices that emit light of a same color are referred to as a same type of light-emitting devices), $V_{data}$-$I_{ini}$ curves thereof under different ambient light luminance may be respectively established, and stored in the memory 22, that is to say, with respect to a light-emitting device that emit light of a certain color, there are a plurality of $V_{data}$-$I_{ini}$ curves, and the plurality of $V_{data}$-$I_{ini}$ curves are $V_{data}$-$I_{ini}$ curves established with respect to different ambient light conditions. As shown in FIG. 7, with respect to a specific light-emitting device, under ambient light luminance 1, the ground state current thereof is $I_{O1}$, a corresponding $V_{data}$-$I_{ini}$ curve is curve 1; under ambient light luminance 2, the ground state current thereof is $I_{O2}$, a corresponding $V_{data}$-$I_{ini}$ curve is curve 2; and under ambient light luminance 3, the ground state current thereof is $I_{O3}$, and a corresponding $V_{data}$-$I_{ini}$ curve is curve 3.

The above is relevant introduction of the memory 22 in the compensation amount computing circuit 2, and the computing unit 23 in the compensation amount computing circuit 2 will be described below.

Referring to FIG. 1, the computing unit 23 is connected with the photo-generated current calibration circuit 21, and is connected with the memory 22; the computing unit 23 is configured to look up a corresponding data voltage $V_{data}$ when $I_{ini}$ is equal to the second photo-generated current and acquire a data voltage $V_{data}'$ of the light-emitting device at a current moment, from the $V_{data}$-$I_{ini}$ curves stored in the memory 22, according to the second photo-generated current obtained through calibration and computation by the photo-generated current calibration circuit 21, and compute to obtain the compensation amount $\Delta V_{data}$ required to compensate for the data voltage of the light-emitting device by using Formula (1) below:

$$\Delta V_{data} = |V_{data}' - V_{data}| \quad (1)$$

It should be noted that the above-described operation of "acquiring a data voltage $V_{data}'$ of the light-emitting device at a current moment" may be specifically implemented as follows: referring to FIG. 2, in the solution provided by this embodiment, the compensation amount computing circuit 2 may be integrated onto the driving chip 500 of the display panel 400, that is to say, the computing unit 23 included by the compensation amount computing circuit 2 is integrated onto the driving chip 500. In fact, the driving chip 500 of the display panel 400 usually includes a data voltage generating circuit 4 for generating data voltages $V_{data}'$ of the light-emitting device at respective moments, and a processor 5 for uniformly controlling the respective functional modules (including the data voltage generating circuit 4). In the solution, since the computing unit 23 is integrated onto the driving chip 500, the computing unit 23 can "acquire the data voltage $V_{data}'$ of the light-emitting device at the current moment" from the processor 5.

In the above-described computation process of the computing unit 23, an actual meaning represented by acquiring the data voltage $V_{data}'$ from the $V_{data}$-$I_{ini}$ curve is: to cause the photodetection field effect transistor $S_{ph}$ to generate the second photo-generated current, and obtain the data voltage required by the light-emitting device, when the light-emitting device is unaged. However, in an actual situation, when the light-emitting device is aged, it is the light emission luminance of the light-emitting device under the data voltage $V_{data}'$ that causes the photodetection field effect transistor $S_{ph}$ to generate a same second photo-generated current. It can be seen that, a difference between $V_{data}'$ and $V_{data}$ can reflect a degree of aging of the light-emitting device 3, and the compensation amount $\Delta V_{data}$ for the data voltage of the light-emitting device can be determined as an absolute value of the difference between $V_{data}'$ and $V_{data}$.

For example, in a case where the data voltage of the light-emitting device is $V_{data5}$, when the light-emitting device is unaged, its luminance is relatively high, and the second photo-generated current generated by the photodetection field effect transistor $S_{ph}$ as sensing the luminance thereof is $I_{ini5}$. After the light-emitting device is aged, also under the data voltage $V_{data5}$, the light emission luminance thereof is lowered, and the second photo-generated current generated by the photodetection field effect transistor $S_{ph}$ as sensing the luminance thereof is $I_{aging5}$. It is assumed that on the $V_{data}$-$I_{ini}$ curve of the light-emitting device, a current magnitude of $I_{aging5}$ corresponds to a data voltage $V_{data3}$ before aging, then, if the light-emitting device needs to approximate the luminance before aging, it is necessary to add $|V_{data5}-V_{data3}|$ on the basis of $V_{data5}$, so that compensation for aging of the light-emitting device is implemented.

It should be noted that the data voltage of the light-emitting device according to the embodiment of the present disclosure specifically refers to the data voltage applied to the thin film transistor for driving the light-emitting device, for example, the voltage signal applied to the data write circuit 120 of the pixel circuit 300 shown in FIG. 2.

With respect to a case where the $V_{data}$-$I_{ini}$ curves of the respective light-emitting devices that emit light of different colors are stored in the memory, and a $V_{data}$-$I_{ini}$ curve of light-emitting devices that emit light of each color includes a plurality of $V_{data}$-$I_{ini}$ curves established with respect to different ambient light conditions, before the computing unit 23 looks up from the $V_{data}$-$I_{ini}$ curves stored in the memory 22 the corresponding data voltage $V_{data}$ when $I_{ini}$ is equal to second photo-generated current, it is necessary to firstly determine the color of light emitted by the light-emitting device, and then determine the external ambient light luminance (for example, with respect to a mobile terminal, the external ambient light luminance may be sensed by a photosensitive probe mounted therein), according to which the $V_{data}$-$I_{ini}$ curve that needs to be used is determined thereafter, in order to accurately find the data voltage $V_{data}$ when $I_{ini}$ is equal to the second photo-generated current.

It should be noted that the above-described computation process that may be implemented by the computing unit 23 may be configured to be implemented by a computer program, and the computer program may be configured in the driving chip 500 of the display device. In addition, referring to FIG. 1 and FIG. 2, the "determining the external ambient light luminance" included in the computing unit 23 in the compensation amount computing circuit 2 may be implemented in this way: the external ambient light luminance is sensed with the photosensitive probe on the terminal device, the detected external ambient light luminance is fed back to the processor 5 in the driving chip 500 of the terminal device, and the computing unit 23 may obtain the external ambient light luminance from the processor 5.

After the compensation amount computing circuit 2 obtains the compensation amount, it is further necessary to determine a value of the data voltage finally supplied to the light-emitting device 3 according to the compensation amount. Therefore, referring to FIG. 1 and FIG. 2, the compensation apparatus provided by the embodiment of the present disclosure may further comprise a data voltage generating circuit 4, which is connected with the processor 5 in the driving chip 500 of the display panel 400, and is configured to acquire the compensation amount computed by the compensation amount computing circuit 2 from the processor 5, sum up the data voltage of the light-emitting device at the current moment and the computed compensation amount, to obtain the compensated data voltage $V_{data}'+\Delta V_{data}$ and output, for example, output to the first electrode of the data write transistor of the pixel circuit 300, to output the data voltage to the gate electrode of the drive transistor through the data write transistor.

In addition, in the solution provided by this embodiment, in the process of compensating the light-emitting device, the actual light emission luminance of the light-emitting device is sensed in real time and further compensated, so that it may be deemed that the compensation process is performed in real time. However, an entire process of using the display device, or during the entire service life of the light-emitting device from leaving the factory to scrap may not always be accompanied by a compensation action, that is to say, the light-emitting device may be compensated on a regular or irregular basis.

For example, referring to FIG. 1 and FIG. 2, the processor 5 in the driving chip 500 is connected with the light sensing circuit 1 and the compensation amount computing circuit 2, and is configured to determine an opportunity for compensating the light-emitting device 3 according to a setting rule, and correspondingly control the light sensing circuit 1 and the compensation amount computing circuit 2 to execute a compensation task. For example, the processor 5 is stored with a setting rule for determining a compensation opportunity; and when the compensation opportunity comes, the processor 5 generates the optical sensing control signal Ctr2 and the sampling control signal Ctr1 to control the light sensing circuit 1 to be turned on, and control the compensation amount computing circuit 2 to be turned on, so that the entire compensation apparatus is activated to execute the compensation task.

For example, the "setting rule" may be compensating the light-emitting device 3 for every time interval, and a time interval between two adjacent compensations is equal or unequal. For example, the "setting rule" may be determined according to an actual aging process of the light-emitting device 3; for example, time periods required for the light-emitting device 3 to have aging degrees of 10%, 20%, 30%, etc., may be respectively estimated by experiments or other means, then compensation may be performed respectively after the light-emitting device 3 is used for these time periods.

It should be noted that, after the compensation task is completed, the processor 5 stores the compensation amount computed for each of the light-emitting devices 3, based on which each frame of picture will have corresponding compensation performed on the data voltage of the light-emitting device 3 during normal display thereafter, until a next compensation task comes, when a new compensation amount is computed according to a new aging degree of the light-emitting device 3, then the processor 5 updates the stored compensation amount, and thereafter compensation is performed on the light-emitting device 3 based on the updated compensation amount during normal display.

It should be noted that, for the sake of clarity and simplicity, the embodiment of the present disclosure does not provide all the constituent units of the compensation apparatus. In order to implement necessary functions of the compensation apparatus, those skilled in the art may provide and set other constituent units not shown according to specific needs, which will not be limited in the embodiment of the present disclosure.

Some embodiments of the present disclosure further provide a display device, as shown in FIG. 2, the display device comprising a light-emitting device, a pixel circuit 300, and a compensation apparatus of the light-emitting device as described above. For example, the compensation apparatus is configured to supply a data write circuit 120 of the pixel circuit 300 with a compensation amount required to compensate the light-emitting device; for specific introduction thereof, the description of the display device shown in FIG. 2 may be referred to, and no details will be repeated here. The display device provided by some embodiments of the present disclosure has same advantageous effects as the above-described compensation apparatus of the light-emitting device, and no details will be repeated here.

Figure 8:
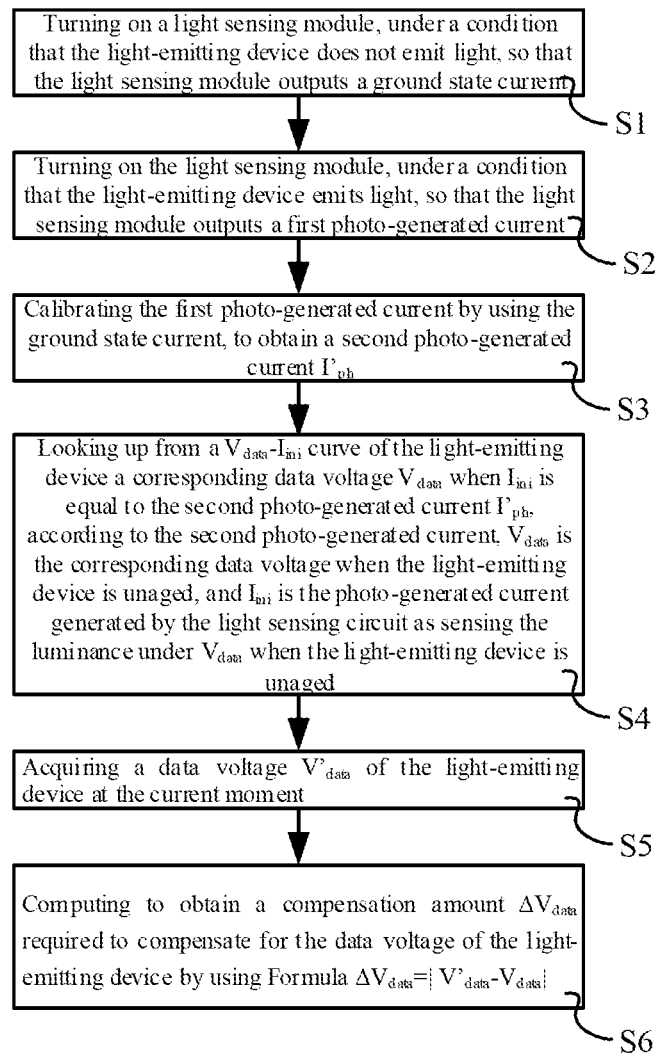
FIG. 8 is a flow chart of a compensation method of a light-emitting device provided by some embodiments of the present disclosure.

The above is detailed description of the compensation apparatus of the light-emitting device provided by the embodiment of the present disclosure; based on this, a compensation method of a light-emitting device provided by an embodiment of the present disclosure will be described below. As shown in FIG. 8, the compensation method of the light-emitting device comprises steps S1 to S6.

Hereinafter, the compensation method provided by the embodiment of the present disclosure will be specifically described in conjunction with FIG. 8 and FIG. 1.

Step S1: turning on a light sensing circuit of the compensation apparatus, under a condition that the light-emitting device does not emit light, when the light-emitting device needs to be compensated, so that the light sensing circuit outputs a ground state current $I_0$.

In step S1, with respect to a problem of when to compensate the light-emitting device during the entire service life of the light-emitting device, a compensation opportunity may be determined by pre-setting a certain rule, so that a processing speed of the display device may be improved. The setting rule may be compensating the light-emitting device 3 for every time interval, and a time interval between two adjacent compensations is equal or unequal; for a specific setting rule, relevant description in the above-described compensation apparatus may be referred to, which will not be repeated here. Of course, compensation for the light-emitting device during the entire service life of the light-emitting device may also be performed in real time, which will not be limited in this embodiment.

In addition, in the above-described step S1, the ground state current $I_0$ includes a leakage current of the light sensing circuit 1 in a dark state; for example, the ground state current $I_0$ further includes a photo-generated current generated by the light sensing circuit 1 as sensing the luminance of ambient interference light (including ambient light, and light emitted by light-emitting devices of other sub-pixels, etc.).

Step S2: turning on the light sensing circuit, under a condition that the light-emitting device emits light, so that the light sensing circuit outputs a first photo-generated current $I_{ph}$.

In step S2, for example, the first photo-generated current $I_{ph}$ includes a photo-generated current generated by the light sensing circuit 1 as sensing the luminance of the light-emitting device, and the ground state current $I_0$ of the light sensing circuit 1.

Step S3: calibrating the first photo-generated current $I_{ph}$ by using the ground state current $I_0$, to obtain a second photo-generated current $I_{ph}'$.

In the above-described step S3, the so-called "calibrating" is substantively eliminating the ground state current $I_0$ included in the first photo-generated current $I_{ph}$, so that the calibrated photo-generated current (i.e., the second photo-generated current $I_{ph}'$) only includes the photo-generated current generated by the light sensing circuit 1 as sensing the luminance of the light-emitting device, to improve accuracy of a compensation amount subsequently computed according to the second photo-generated current $I_{ph}'$.

For example, in one example, the above-described step S3 may include steps of:

Step S31: sampling with the ground state current $I_0$ as an input signal; for example, the output signal $V_{out1}$ after the sampling may be expressed by using Formula (2) below:

$$V_{out1} = \frac{1}{C}\int_0^t I_0(t)dt \quad (2)$$

Where C is a capacitance value of a storage capacitor in the compensation apparatus; and t is time for sampling with the ground state current $I_0$ as the input signal.

Step S32: sampling with the first photo-generated current $I_{ph}$ as an input signal, and expressing an output signal $V_{out2}$ after the sampling by using Formula (3) below:

$$V_{out2} = V_{out1} - \frac{1}{C}\int_0^t I_{ph}(t)dt \quad (3)$$

Where C is a capacitance value of an integrating capacitor in the compensation apparatus, which is equal to the capacitance value of the storage capacitor in the compensation apparatus; t is time for sampling with the first photo-generated current $I_{ph}$ as the input signal, and the time is equal to the time for sampling with the ground state current $I_0$ as the input signal.

Step S33: performing calibration computation to obtain the second photo-generated current $I_{ph}'$ by using Formula (4) below:

$$\int_0^t I_{ph}'(t)dt = -V_{out2}C \quad (4).$$

A derivation process of the above-described Formula (4) includes: since $I_{ph}=I_0+I_{ph}'$, from Formula (3), it may be derived as:

$$V_{out2} = V_{out1} - \frac{1}{C}\int_0^t [I_0(t) + I_{ph}'(t)]dt =$$

$$V_{out1} - \frac{1}{C}\int_0^t I_0(t)dt - \frac{1}{C}\int_0^t I_{ph}' = -\frac{1}{C}\int_0^t I_{ph}'(t)dt,$$

so as to further obtain:

$$\int_0^t I_{ph}'(t)dt = -V_{out2}C.$$

Step S4: looking up from a $V_{data}-I_{ini}$ curve of the light-emitting device a corresponding data voltage $V_{data}$ when $I_{ini}$ is equal to the second photo-generated current $I_{ph}'$, according to the second photo-generated current $I_{ph}'$.

In the above-described step S4, referring to FIG. 5, $V_{data}$ is the corresponding data voltage when the light-emitting device 3 is unaged, and $I_{ini}$ is the photo-generated current generated by the light sensing circuit 1 as sensing the luminance of the light-emitting device 3 under the corresponding data voltage $V_{data}$.

With respect to the light sensing circuit 1 having the photodetection field effect transistor $S_{ph}$ as a main photosensitive element, it has different responsiveness to light of different colors, so $V_{data}-I_{ini}$ curves of light-emitting devices that emit light of different colors are different from one another; in addition, under ambient light of different intensities, photo-generated currents generated by the photodetection field effect transistor $S_{ph}$ as sensing luminance of a same light-emitting device are different from one another, so $V_{data}-I_{ini}$ curves of the light-emitting device under ambient light of different intensities are also different from one another. Based on this, before looking up from the $V_{data}-I_{ini}$ curves of the light-emitting device the corresponding data voltage $V_{data}$ when $I_{ini}$ is equal to the second photo-generated current $I_{ph}'$, it is necessary to determine a color of light emitted by the light-emitting device, acquire ambient light luminance Lum at a current moment, and select the $V_{data}$–$I_{ini}$ curve of the light-emitting device at the current moment according thereto. Wherein, the ambient light luminance Lum at the current moment may be acquired by a photosensitive component integrated on a display terminal (for example, a photosensitive probe on a mobile phone).

S5: acquiring a data voltage $V_{data}'$ of the light-emitting device 3 at the current moment.

In the above-described step S5, for example, the data voltage $V_{data}'$ of the light-emitting device 3 at the current moment is substantively the actual data voltage corresponding to the current luminance of light emitted by the light-emitting device 3 after aging; and since the light-emitting device 3 is aged, the voltage should be larger than the data voltage required for the same luminance of light emitted by the light-emitting device 3 before aging.

In the above-described step S5, the data voltage $V_{data}'$ may be directly acquired from the driving chip 500 of the display device.

S6: computing to obtain a compensation amount $\Delta V_{data}$ required to compensate for the data voltage of the light-emitting device 3 by using Formula (1) below:

$$\Delta V_{data}=|V_{data}'-V_{data}| \qquad (1)$$

In the above-described step S6, a difference between $V_{data}'$ and $V_{data}$ can characterize a degree of aging of the light-emitting device 3, so it may be determined that the compensation amount $\Delta V_{data}$ is equal to an absolute value of the difference between $V_{data}'$ and $V_{data}$.

It should be added that, after the computing to obtain a compensation amount $\Delta V_{data}$, the method may further comprise steps of: summing up the data voltage $V_{data}'$ of the light-emitting device at the current moment and the computed compensation amount $\Delta V_{data}$, to obtain the compensated data voltage, for example, outputting the compensated data voltage into a gate electrode of a first transistor T1 (i.e., a drive transistor) of a pixel circuit 300 through a data write circuit 120, so as to control a conduction degree of the drive transistor, to control a drive current flowing to the light-emitting device 3, so as to compensate the light-emitting device 3.

Through the above-described steps S1 to S6, the light-emitting device 3 is compensated, and the process may be configured to be processed and executed by the driving chip 500 in an actual use process of the display device.

It should be noted that the flow of the compensation method provided by some embodiments of the present disclosure may comprise more or fewer operations, and these operations may be executed serially or concurrently. Although the flow of the compensation method as described above includes a plurality of operations occurring in a specific order, it should be clearly understood that the order of the plurality of operations is not limited. The compensation method as described above may be executed once, or may also be executed for multiple times according to predetermined conditions.

It should be pointed out that, with respect to the $V_{data}$–$I_{ini}$ curve of the light-emitting device 3 used in the process, it is necessary to pre-establish the $V_{data}$–$I_{ini}$ curve, and store the established $V_{data}$–$I_{ini}$ curve in the display device, specifically, stored in a memory element inside the display device. Steps of establishing and storing the $V_{data}$–$I_{ini}$ curve may be configured to be executed during ex-factory production of the display device. For example, the step of establishing the $V_{data}$–$I_{ini}$ curve of the light-emitting device 3 may include a process below:

Firstly, enabling the light-emitting device 3 of the display device to emit light of different luminance, and performing an optical sensing test on the light sensing circuit 1, to acquire at least two groups of test data ($I_{ph,test}$, $P_{opt}$). For example, $I_{ph,test}$ is the photo-generated current generated by the light sensing circuit 1 as sensing luminance $P_{opt}$; and $P_{opt}$ is an optical power of the light-emitting device 3, and is used for characterizing luminance of light emitted by the light-emitting device 3.

Then, respectively plugging the at least two groups of test data ($I_{ph,test}$, $P_{opt}$) obtained into Formula (5) and Formula (6) below, and judging whether the at least two groups of test data ($I_{ph,test}$, $P_{opt}$) obtained meet Formula (5) or meet Formula (6) below:

$$I_{ph,test}=A \cdot P_{opt} \qquad (5)$$

Where, A is a first proportional coefficient.

$$I_{ph,test} = \frac{BkT}{q}\ln\left(1 + \frac{\eta q \gamma P_{opt}}{I_{pd\ hc}}\right) \qquad (6)$$

Where B is a second proportional coefficient; k is a Boltzmann constant; T is the absolute temperature; q is an electron charge; $\eta$ is a photoelectric conversion quantum efficiency; hc/$\lambda$ is photon energy; and $I_{pd}$ is a minority dark current.

If Formula (5) is met, then the light sensing circuit 1 having the photodetection field effect transistor $S_{ph}$ as a main photosensitive element belongs to a Photoconductive mode (PC) mode, and translation of a characteristic curve $I_{ds}$–$V_{gs}$ of the photodetection field effect transistor $S_{ph}$ (a curve with a working current $I_{ds}$ as a horizontal axis, and a working voltage $V_{gs}$ as a vertical axis) occurs only in a vertical axis direction, and carrier mobility does not change. Then, $I_{ph,test}=(q\mu pE)WD=A \cdot P_{opt}$, where, q is an electron charge constant, $\mu$ is multi-carrier mobility, p is a carrier concentration, E is an electric field in a channel, W is a gate width, and D is a thickness of a photosensitive layer. Function fitting may be performed once on $V_{data}$ and $I_{ini}$ in the $V_{data}$–$I_{ini}$ curve to be established, to establish the $V_{data}$–$I_{ini}$ curve.

Figure 9:
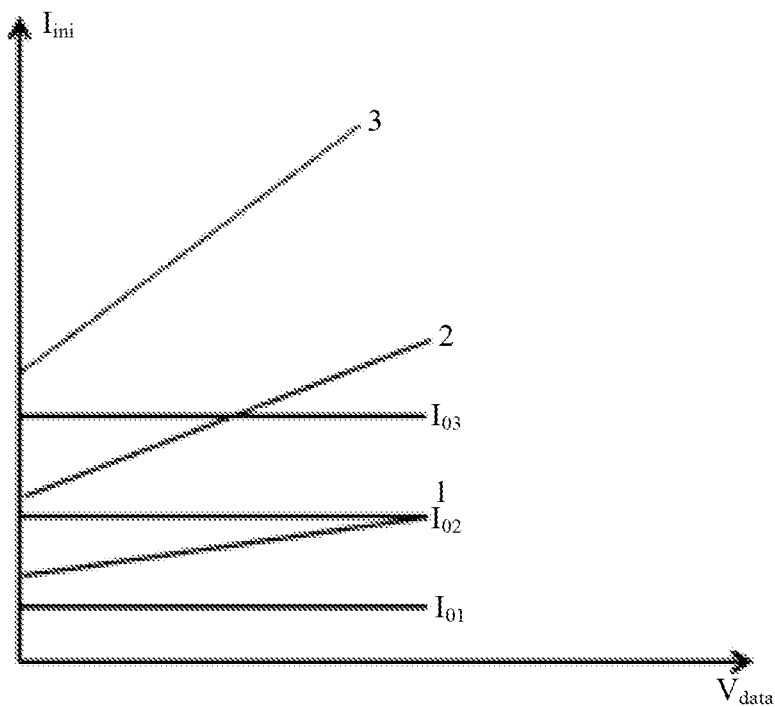
FIG. 9 is a schematic diagram of a $V_{data}$-$I_{ini}$ curve in a PC mode according to some embodiments of the present disclosure.

As shown in FIG. 9, straight lines 1, 2 and 3 are respectively $V_{data}$–$I_{ini}$ curves under different ambient light. In addition, straight lines $I_{o1}$, $I_{o2}$ and $I_{o3}$ are respectively ground state currents of the photodetection field effect transistor $S_{ph}$ under ambient light conditions corresponding to the straight lines 1, 2 and 3.

If Formula (6) is met, then the light sensing circuit 1 having the photodetection field effect transistor $S_{ph}$ as the main photosensitive element belongs to a Photovoltaic mode (PV) mode, and translation of the characteristic curve $I_{ds}$–$V_{gs}$ of the photodetection field effect transistor $S_{ph}$ (a curve with the working current $I_{ds}$ as the horizontal axis, and the working voltage $V_{gs}$ as the vertical axis) manifests only in a horizontal axis direction, that is, threshold drift. Exponential function fitting may be performed on $V_{data}$ and $I_{ini}$ in the $V_{data}$–$I_{ini}$ curve to be established, to establish the $V_{data}$–$I_{ini}$ curve.

Figure 10:
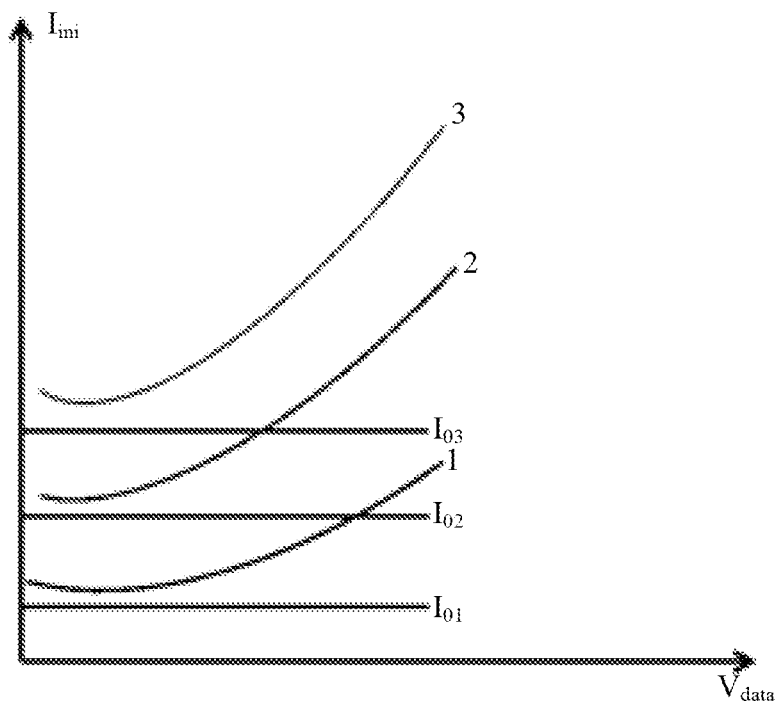
FIG. 10 is a schematic diagram of a $V_{data}$-$I_{ini}$ curve in a PV mode according to some embodiments of the present disclosure.

As shown in FIG. 10, curves 1, 2 and 3 are respectively $V_{data}$–$I_{ini}$ curves under different ambient light. In addition, the straight lines $I_{o1}$, $I_{o2}$ and $I_{o3}$ are respectively ground state currents of the photodetection field effect transistor $S_{ph}$ under ambient light conditions corresponding to the straight lines 1, 2 and 3.

For example, in the above-described process of establishing the $V_{data}$–$I_{ini}$ curve, by firstly judging whether the characteristic curve $I_{ds}$–$V_{gs}$ of the light sensing circuit 1 having the photodetection field effect transistor $S_{ph}$ as the main photosensitive element belongs to the PC mode or the PV mode, and then establishing the $V_{data}$-$I_{ini}$ curve specifically, the $V_{data}$-$I_{ini}$ curve is closer to an actual situation, which is favorable for improving accuracy of compensation.

It is worth emphasizing that, $V_{data}$-$I_{ini}$ curves may be respectively established with respect to light-emitting devices that emit light of different colors, by using the above-described process of establishing the $V_{data}$-$I_{ini}$ curve. For example, with respect to a light-emitting device that emit light of a certain color, $V_{data}$-$I_{ini}$ curves thereof under different ambient light conditions may be respectively established, as shown in FIG. 9 and FIG. 10.

Based on the above-described compensation method of the light-emitting device, an embodiment of the present disclosure further provides a computer product, the computer product comprising one or more processors, and the processor being configured to execute computer instructions to execute one or more steps in the above-described compensation method of the light-emitting device. The computer product may specifically be a driving chip in a display device, or other computer product that can drive the display device to display.

The above is detailed description of the compensation apparatus and compensation method of the light-emitting device provided by the embodiments of the present disclosure. When applied to the display device, the above-described compensation apparatus and compensation method will bring structural changes to a display substrate of the display device; and hereinafter, a structure of the display substrate in the embodiment of the present disclosure will be described in detail.

As shown in FIG. 1, the display substrate provided by this embodiment comprises a plurality of sub-pixels; each sub-pixel includes a light-emitting device; and light-emitting devices included in sub-pixels of different colors emit light of different colors, for example, a light-emitting device of a red (R) sub-pixel is a light-emitting device that emits red light, a light-emitting device of a green (G) sub-pixel is a light-emitting device that emits green light, and a light-emitting device of a blue (B) sub-pixel is a light-emitting device that emits blue light.

The above-described display substrate further comprises at least one light sensing circuit 1; the at least one light sensing circuit 1 is provided corresponding to at least one light-emitting device; and the light sensing circuit 1 is configured to output a first photo-generated current under a condition that a light-emitting device corresponding thereto emits light, when the light-emitting device corresponding thereto needs to be compensated.

Figure 11:
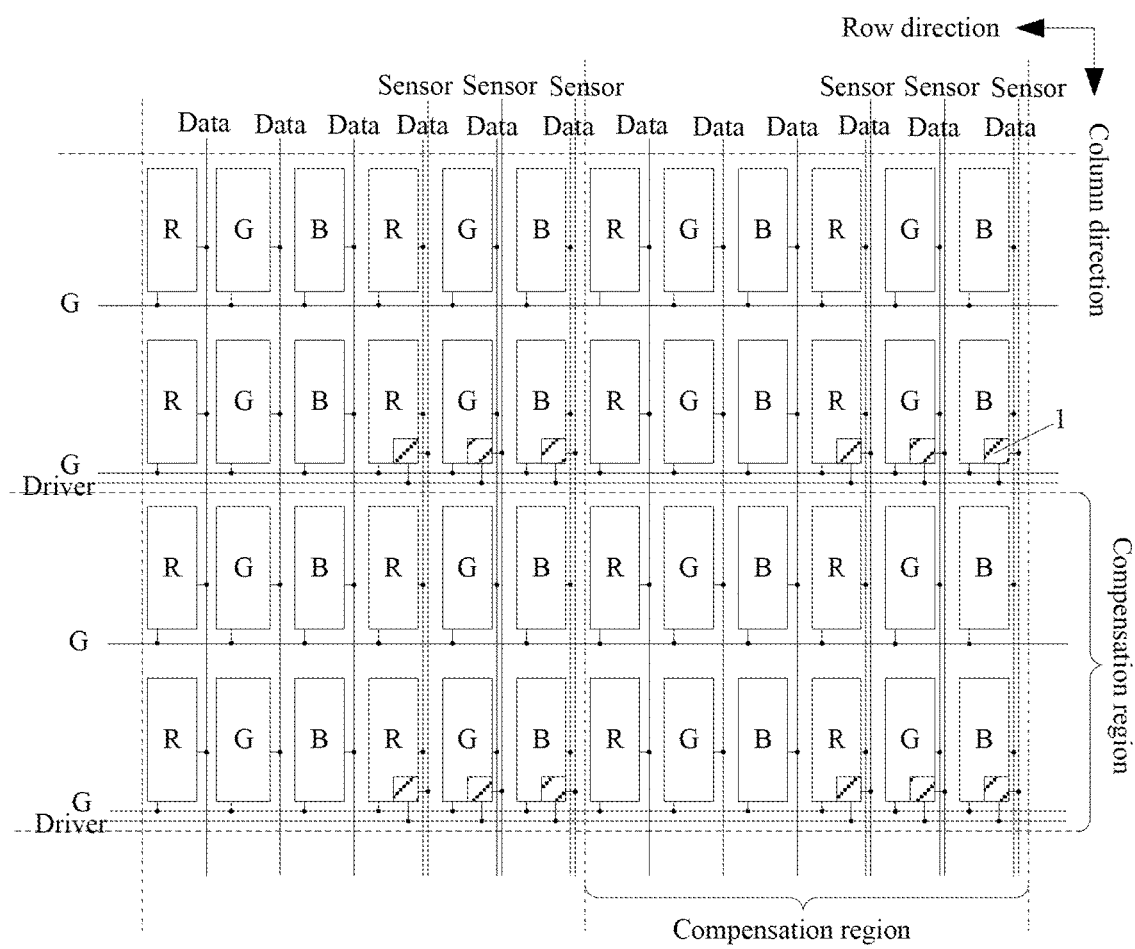
FIG. 11 is a schematic diagram of a pixel architecture of a display substrate according to some embodiments of the present disclosure.

For example, in one example, a light sensing circuit 1 may be in one-to-one correspondence with a light-emitting device: a specific arrangement mode may be that one light sensing circuit 1 is provided corresponding to a light-emitting device of each sub-pixel, to implement respective highly-accurate compensation for each light-emitting device; or may also be an arrangement mode shown in FIG. 11, in which the display substrate is divided into a plurality of compensation regions (horizontal and vertical dashed lines in FIG. 11 are dividing lines), each compensation region includes a plurality of sub-pixels of different colors, that is, includes a plurality of light-emitting devices that emit light of different colors, and a representative light-emitting device is respectively selected from light-emitting devices that emit light of each color, with respect to which one light sensing circuit 1 is provided, in which way uniform compensation for respective light-emitting devices in each compensation region may be implemented, so that data processing and computation amount is reduced, under the premise of ensuring higher compensation accuracy.

For example, in another example, as shown in FIG. 11, each compensation region includes 12 sub-pixels, that is, includes 12 light-emitting devices: a light-emitting device that emits red light at a lower right corner is selected from 4 light-emitting devices that emit red light from the 12 light-emitting devices, to have one light sensing circuit 1 correspondingly provided, so that uniform compensation for the 4 light-emitting devices that emit red light may be implemented; a light-emitting device that emits green light at the lower right corner is selected from 4 light-emitting devices that emit green light from the 12 light-emitting devices, to have one light sensing circuit 1 correspondingly provided, so that uniform compensation for the 4 light-emitting devices that emit green light may be implemented; a light-emitting device that emits blue light at the lower right corner is selected from 4 light-emitting devices that emit blue light from the 12 light-emitting devices, to have one light sensing circuit 1 correspondingly provided, so that uniform compensation for the 4 light-emitting devices that emit blue light may be implemented. It should be noted that the number of the plurality of sub-pixels is only exemplary, and may be determined according to actual conditions, which will not be limited in the embodiment of the present disclosure.

It should be noted that, in order to ensure uniformity of a display picture, distribution of light sensing circuits 1 in the entire display substrate should be as uniform and symmetrical as possible; further, distribution of light sensing circuits 1 in each compensation region should also be as uniform and symmetrical as possible.

For example, in one example, as shown in FIG. 12 to FIG. 16, the light sensing circuit 1 includes a photodetection field effect transistor 9; and a structure of the photodetection field effect transistor 9 includes: a first gate electrode 91, a first active layer 92, a first source electrode 93 and a first drain electrode 94.

A structure of a light-emitting device 3 corresponding to the photodetection field effect transistor 9 includes: a first electrode 31, a light-emitting layer 32 and a second electrode 33 sequentially stacked in a direction perpendicular to a base substrate 6 of the display substrate and directing from the base substrate 6 toward the light-emitting device 3. For example, in one example, the light-emitting device 3 may be a light-emitting device 3 of a bottom emitting type, that is, the first electrode 31 thereof can transmit light, and the second electrode 33 can reflect light, so that light is mainly emitted from a side of the base substrate 6.

The display substrate further comprises a plurality of drive transistors 8, and the respective drive transistors 8 are provided corresponding to the respective light-emitting devices 3. The first electrode 31 of the light-emitting device 3 is electrically connected with a second drain electrode 84 of a drive transistor 8 corresponding thereto; the first electrode 31 may serve as an anode of the light-emitting device 3; and the second electrode 33 may serve as a cathode of the light-emitting device 3.

The photodetection field effect transistor 9 may be located on a side of the corresponding light-emitting device 3 that faces the base substrate 6, which thus, facilitates simultaneous formation of some structures in the photodetection field effect transistor 9 and the structure in the drive transistor 8, to simplify a fabrication process without increasing a thickness of the display substrate.

Figure 12:
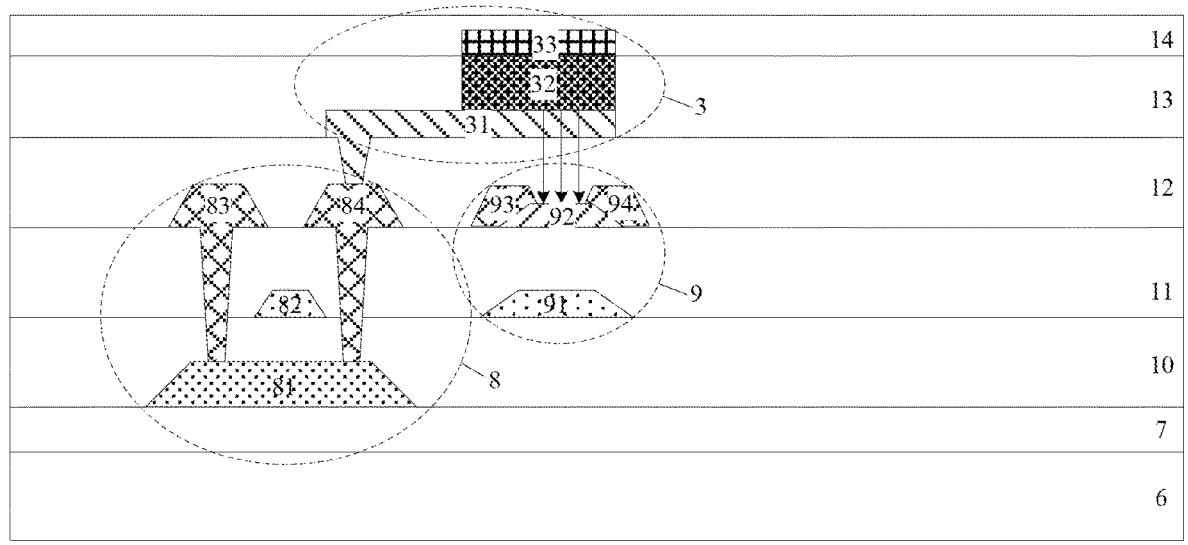
FIG. 12 is a cross-sectional structural diagram I of a display substrate according to some embodiments of the present disclosure.

A relative positional relationship between the photodetection field effect transistor 9 and the light-emitting device 3 corresponding thereto may follow two solutions below:

Solution One: as shown in FIG. 12, the photodetection field effect transistor 9 is located directly below the light-emitting device 3 corresponding thereto, that is, an orthogonal projection of the photodetection field effect transistor 9 on the base substrate 6 is located within a range of an orthogonal projection of the light-emitting device 3 corresponding to the photodetection field effect transistor 9 on the base substrate 6.

In Solution One, the light-emitting device 3 is used to shield external ambient light incident onto the photodetection field effect transistor 9, and more light of the light-emitting device 3 (the arrowed line in FIG. 12 represents light) may be incident in a region of the first active layer 92 (i.e., a channel region) between the first source electrode 93 and the first drain electrode 94 of the photodetection field effect transistor 9, so as to reduce influence of light emitted by light-emitting devices of surrounding sub-pixels and external ambient light on the photodetection field effect transistor 9 sensing luminance of the light-emitting device 3, to improve compensation accuracy. For example, the second electrode 33 in the light-emitting device 3 is a structure that mainly plays a role in shielding light emitted from the light-emitting devices of the surrounding sub-pixels and external ambient light, so the second electrode 33 is made of, for example, an opaque and/or highly reflective material.

The first electrode 31 of the light-emitting device 3 may include a first transparent conductive layer 311, a metal conductive layer 312 and a second transparent conductive layer 313 which are sequentially stacked in the direction perpendicular to the base substrate 6 and directing from the base substrate 6 toward the light-emitting device 3; the first transparent conductive layer 311 and the second transparent conductive layer 313 may be made of, for example, indium tin oxide (ITO), and the metal conductive layer 312 may be made of, for example, silver (Ag).

Figure 13:
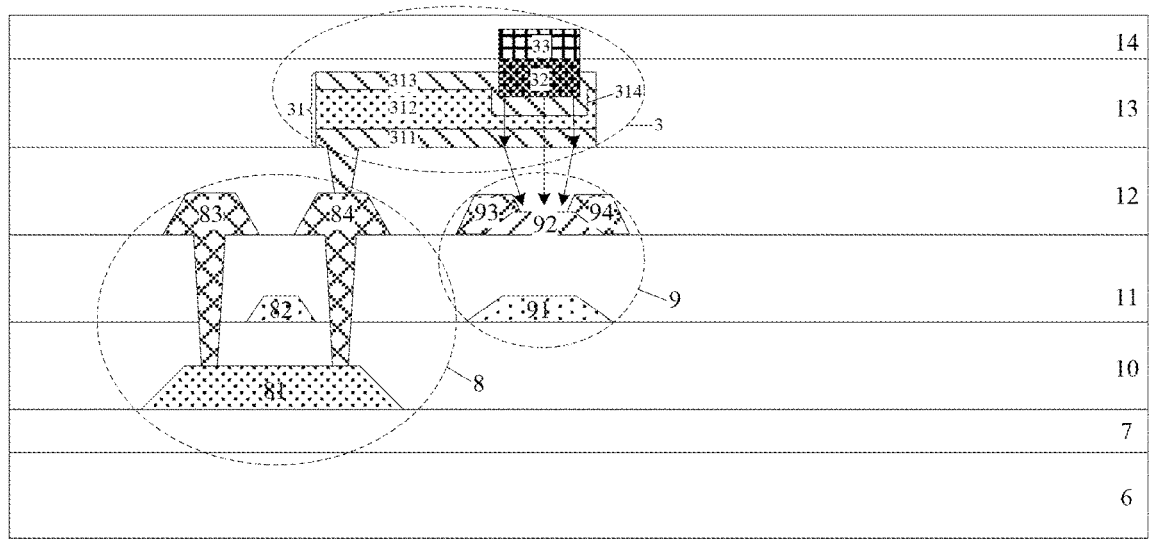
FIG. 13 is a cross-sectional structural diagram II of a display substrate according to some embodiments of the present disclosure.

Referring to FIG. 13, based on the above-described structure of the first electrode 31, for example, the metal conductive layer 312 of the first electrode 31 has a blind hole 314 (i.e., a hole that does not perforate the metal conductive layer 312) on a side facing away from the base substrate 6; a position of the blind hole 314 corresponds to the region of the first active layer 92 between the first source electrode 93 and the first drain electrode 94 of the photodetection field effect transistor 9, and the light-emitting layer 32 of the light-emitting device 3 is at least partially located in the blind hole 314. Light transmittance of the first transparent conductive layer 311 and the second transparent conductive layer 313 in the first electrode 31 is higher than light transmittance of the metal conductive layer 312; the above-described structure is designed such that a thickness of the metal conductive layer 312 in the first electrode 31 is reduced at the position of the blind hole 314, which increases light transmittance of the first electrode 31 at the position of the blind hole 314; the light-emitting layer 32 is partially located in the blind hole 314, so that more light emitted by the light-emitting layer 32 (the arrowed line in FIG. 13 represents light) may be incident on the region of the first active layer 92 between the first source electrode 93 and the first drain electrode 94 of the photodetection field effect transistor 9; and meanwhile, the metal conductive layer 312 in the first electrode 31 has a greater thickness in a region other than the position of the blind hole 314, so that it can achieve a better effect of shielding light emitted from the light-emitting devices of the surrounding sub-pixels and the external ambient light.

In the above-described structural design, a fabrication process of the blind hole 314 may include: after forming the metal conductive layer 312, patterning the metal conductive layer 312, removing a material in a region of the blind hole to be formed on one side of the metal conductive layer 312 that faces away from the base substrate, to form the blind hole 314. A depth of the blind hole 314 (i.e., a size in the direction perpendicular to the base substrate 6) should not be too shallow, otherwise, an effect of improving the light transmittance of the first electrode 31 at the position of the blind hole 314 is not significant; the depth of the blind hole 314 should not be too deep, otherwise, carrier mobility of the first electrode 31 at the position of the blind hole 314 is lowered, which affects light emission of the light-emitting layer 32. For example, the depth of the blind hole 314 may be between five percent and fifteen percent of the thickness of the metal conductive layer 312.

In the above-described structural design, an orthogonal projection of the region of the first active layer 92 between the first source electrode 93 and the first drain electrode 94 of the photodetection field effect transistor 9 on the base substrate 6 may be located within a range of an orthogonal projection of the light-emitting layer 32 on the base substrate 6 inside the blind hole 314, such that the region of the first active layer 92 between the first source electrode 93 and the first drain electrode 94 is entirely located within a light emission range of the light-emitting layer 32, which further reduces probability of light emitted by the light-emitting devices of the surrounding sub-pixels and the external ambient light being irradiated on the region of the first active layer 92 between the first source electrode 93 and the first drain electrode 94.

Figure 14:
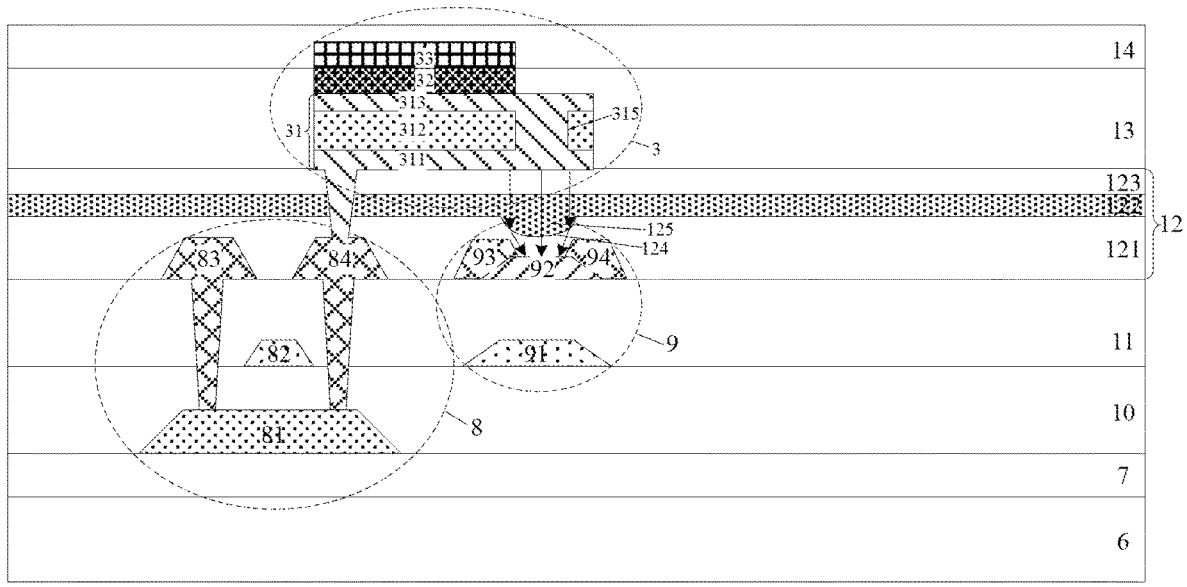
FIG. 14 is a cross-sectional structural diagram III of a display substrate according to some embodiments of the present disclosure.

For example, in another example, referring to FIG. 14, the metal conductive layer 312 of the first electrode 31 of the light-emitting device 3 has a via hole 315 therein; the first transparent conductive layer 311 and the second transparent conductive layer 313 of the first electrode 31 are in communication with each other through the via hole 315; and a position of the via hole 315 corresponds to the region of the first active layer 92 between the first source electrode 93 and the first drain electrode 94 of the photodetection field effect transistor 9. The light transmittance of the first transparent conductive layer 311 and the second transparent conductive layer 313 in the first electrode 31 is higher than the light transmittance of the metal conductive layer 312; in the foregoing structural design, a portion of the metal conductive layer 312 at the position of the via hole 315 is removed, which increases light transmittance of the first electrode 31 at the position of the via hole 315, so that more light emitted from the light-emitting layer 32 may be incident on the region of the first active layer 92 between the first source electrode 93 and the first drain electrode 94 of the photodetection field effect transistor 9; and meanwhile, the metal conductive layer 312 is present in a region other than the position of the via hole 315, so that it can achieve a better effect of shielding light emitted from the light-emitting devices of the surrounding sub-pixels and the external ambient light.

In the above-described structural design, an orthogonal projection of the light-emitting layer 32 of the light-emitting device 3 on the base substrate 6 may not overlap with an orthogonal projection of the via hole 315 on the base substrate 6, that is to say, the light-emitting layer 32 is not located above the via hole 315. An advantage of such design is that: the arrangement of the metal conductive layer 312 in the first electrode 31 may improve carrier mobility; since the metal conductive layer 312 is not present at the position of the via hole 315, carrier mobility of the portion in the first electrode 31 that corresponds to the position of the via hole 315 is lower than carrier mobility of a portion of the first electrode 31 other than that corresponds to the position of the via hole 315; the light-emitting layer 32 is made not to be located above the via hole 315, so as to avoid a region of the first electrode 31 that has lower carrier mobility, which is favorable for improving luminous efficiency of the light-emitting device 3.

In the above-described structural design, the display substrate further comprises a passivation layer 12 located between the photodetection field effect transistor 9 and the light-emitting device 3; the passivation layer 12 is provided therein with a microlens 125; a position of the microlens 125 corresponds to the region of the first active layer 92 between the first source electrode 93 and the first drain electrode 94 of the photodetection field effect transistor 9; the microlens 125 has a light converging characteristic, and can converge light incident through the via hole 315 onto the region of the first active layer 92 between the first source electrode 93 and the first drain electrode 94 of the photodetection field effect transistor 9 (the arrowed line in FIG. 14 represents light). The microlens 125 may specifically be a convex lens, and may be made of highly-refractive silicon oxide ($SiO_2$) Referring to FIG. 14, a process of fabricating the microlens 125 may include, for example: firstly, forming a first sub-layer 121 on the side of the photodetection field effect transistor 9 that faces away from the base substrate 6 by using a passivation layer material, fabricating a groove 124 at a position corresponding to the region of the first active layer 92 between the first source electrode 93 and the first drain electrode 94 of the photodetection field effect transistor 9 on a surface of the first sub-layer 121 that faces away from the base substrate 6, a bottom surface of the groove 124 being an arc surface; then, forming a second sub-layer 122 on a side of the first sub-layer 121 that faces away from the base substrate 6 by using a microlens material, in which process, a portion of the microlens material is deposited in the groove 124, to form the microlens 125; and thereafter, forming a third sub-layer 123 on a side of the second sub-layer 122 that faces away from the base substrate 6 by using a passivation layer material, wherein, the first sub-layer 121, the second sub-layer 122 and the third sub-layer together constitute the passivation layer 12.

Figure 15:
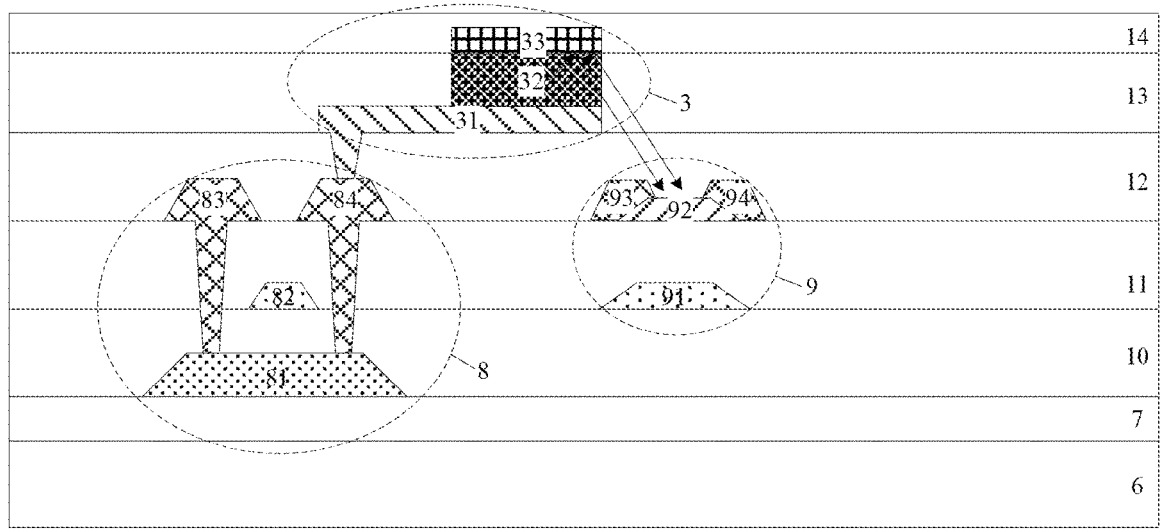
FIG. 15 is a cross-sectional structural diagram IV of a display substrate according to some embodiments of the present disclosure.

Solution Two: as shown in FIG. 15, the photodetection field effect transistor 9 is located beside a lower side of the light-emitting device 3 corresponding thereto; and the photodetection field effect transistor 9 and the drive transistor 8 corresponding to the light-emitting device 3 which corresponds to the photodetection field effect transistor 9 are respectively located on both sides of the light-emitting device 3 corresponding to the photodetection field effect transistor 9. That is, an orthogonal projection of the photodetection field effect transistor 9 on the base substrate 6 does not overlap or partially overlap with an orthogonal projection of the light-emitting device 3 corresponding to the photodetection field effect transistor 9 on the base substrate 6; and the orthogonal projection of the photodetection field effect transistor 9 on the base substrate 6 and an orthogonal projection of the drive transistor 8 corresponding to the light-emitting device 3 that corresponds to the photodetection field effect transistor 9 on the base substrate 6 are respectively located on both sides of the orthogonal projection of the light-emitting device 3 corresponding to the photodetection field effect transistor 9 on the base substrate 6.

In Solution Two, light emitted by the light-emitting layer 32 of the light-emitting device 3 may be reflected by the second electrode 33 to the region of the first active layer 92 between the first source electrode 93 and the first drain electrode 94 of the photodetection field effect transistor 9 (the arrowed line in FIG. 15 represents light), to cause the photodetection field effect transistor 9 to generate a light sensing signal (a photo-generated current). In order to increase light reflection efficiency of the second electrode 33, the second electrode 33 may be made of a highly-reflective material.

In Solution Two, a distance between the photodetection field effect transistor 9 and the corresponding drive transistor 8 is relatively far, which, thus, can lower an adverse effect of a fabrication process of the photodetection field effect transistor 9, particularly, a semiconductor process for fabricating the first active layer 92 of the photodetection field effect transistor 9, on the drive transistor 8.

Figure 16:
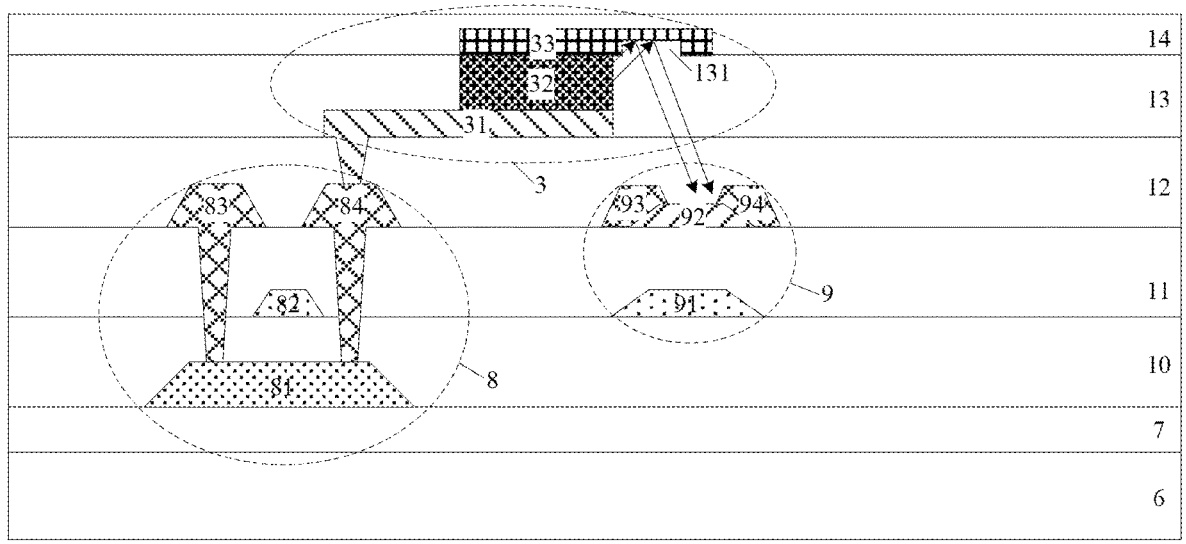
FIG. 16 is a cross-sectional structural diagram V of a display substrate according to some embodiments of the present disclosure.

For example, referring to FIG. 16, in another example, the display substrate further comprises a pixel defining layer 13; the light-emitting layer of the light-emitting device 3 is located within a pixel region defined by the pixel defining layer 13; the pixel defining layer 13 has a protrusion 131 on one side facing away from the base substrate 6; and an orthogonal projection of the protrusion 131 on the base substrate 6 does not overlap with an orthogonal projection of the light-emitting layer 32 on the base substrate 6.

In the above-described structural design, the pixel defining layer 13 has the protrusion 131 on one side that faces away from the base substrate 6, such that the subsequently formed second electrode 33 is formed with a groove whose opening faces the base substrate 6 at the position of the protrusion 131, and thus, light incident on a top surface of the protrusion 131 among light emitted from the light-emitting layer 32 is confined in the groove formed by the second electrode 33, and most of the light can be finally reflected by the groove of the second electrode 33 to the region of the first active layer 92 between the first source electrode 93 and the first drain electrode 94 of the photodetection field effect transistor 9, and rarely scattered, refracted or reflected to a region other than the region of the first active layer 92 between the first source electrode 93 and the first drain electrode 94 of the photodetection field effect transistor 9, which is favorable for improving sensitivity for the photodetection field effect transistor 9 to sense luminance of the light-emitting device 3. A process of fabrication the protrusion 131 may include, for example: depositing a pixel defining layer material in a region where the protrusion is to be formed on a surface of the pixel defining layer 13 that faces away from the base substrate 6, to form the protrusion 131.

In the above-described structural design, a height of the protrusion 131 (i.e., a size in the direction perpendicular to the base substrate 6) should not be too low, otherwise, an effect of improving light reflection efficiency is not obvious; and the height of the protrusion 131 should not be too high, otherwise, the second electrode 33 covering thereon forms an excessively high step, which affects electrical conductivity of the second electrode 33. For example, a slope formed by a side wall of the protrusion 131 is an obtuse angle, or the side wall of the protrusion 131 is stepped, so that a thin film of the second electrode 33 covering thereon has good continuity without breaking.

In Solution Two as described above, the microlens may also be provided in the passivation layer 12; for a position, a structure, a characteristic, a preparation method, etc., of the microlens, the microlens 125 mentioned in Solution One may be referred to; by providing the microlens, light emitted by the corresponding light-emitting device can be efficiently converged on the region of the first active layer 92 between the first source electrode 93 and the first drain electrode 94 of the photodetection field effect transistor 9, so as to improve photosensitive accuracy of the photodetection field effect transistor 9.

In the display substrate provided by the present disclosure, the first active layer 92 of the photodetection field effect transistor 9 may be made of an inorganic photosensitive material, for example, a gallium nitride (GaN) and/or nitrogen arsenic gallium compound (GaAsN) inorganic photosensitive semiconductor material. The inorganic photosensitive material has high carrier mobility, and can control response time of the photodetection field effect transistor 9 at a microsecond (vs) scale, so as to ensure requirements of a screen refresh rate (commonly 60 Hz) and screen resolution of the display device on responsiveness of the photodetection field effect transistor 9, for example, a Quarter High Definition (QHD) screen (of 960×540 screen resolution) requires response time of the photodetection field effect transistor 9 to be controlled below 6.5 μs.

The first active layer 92 of the photodetection field effect transistor 9 may also be made of an organic photosensitive material, for example, at least one of organic photosensitive semiconductor materials such as polythiophene and derivatives, polypyrrole and derivatives, pentacene and derivatives, tetracene and derivatives or copper phthalocyanine and derivatives. By using the organic photosensitive material, patterning of the first active layer 92 may be performed by using a fabrication process having a lower requirement on a process temperature, for example, a process such as printing, coating or ink jetting, so as to effectively avoid influence of high temperature on performance of the drive transistor 8.

In the display substrate provided by the present disclosure, as shown in FIG. 12 to FIG. 16, the drive transistor 8 includes: a second gate electrode 82, a second active layer 81, a second source electrode 83 and a second drain electrode 84. The first gate electrode 91 of the photodetection field effect transistor 9 may be located in a same film layer as the second gate electrode 82 of the drive transistor 8, that is to say, both may be prepared by using a same patterning process, so as to simplify the fabrication process. The first source electrode 93 and the first drain electrode 94 of the photodetection field effect transistor 9 may be located on a same film layer as the second source electrode 83 and the second drain electrode 84 of the drive transistor 8, that is to say, they may be prepared by using a same patterning process, so as to simplify the fabrication process.

The display substrate according to some embodiments of the present disclosure may further comprise: at least one driver line, and at least one sensor line. Wherein, the at least one driver line is correspondingly connected with the at least one light sensing circuit, and is configured to input an optical sensing control signal Ctr2 to the corresponding light sensing circuit to control operation of the corresponding light sensing circuit; the at least one sensor line is correspondingly connected with the at least one light sensing circuit, and is configured to transmit a current signal output by the corresponding light sensing circuit to the driving chip bound to the display substrate, to facilitate the compensation amount computing circuit 2 in the compensation apparatus provided by the embodiment of the present disclosure to acquire the current signal. It should be noted that the driver line may be specifically connected with a processor 5 in the driving chip to obtain an optical sensing control signal Ctr2 from the processor 5, to further drive the light sensing circuit 1 to perform optical sensing on luminance of light emitted by the corresponding light-emitting device 3; and the sensor line may be specifically connected with the compensation amount computing circuit 2 in the driving chip, to transmit the first photo-generated current generated by the light sensing circuit 1 to the compensation amount computing circuit 2.

For example, referring to FIG. 11, light sensing circuits 1 located in a same row may be connected with a same driver line, and light sensing circuits 1 located in a same column may be connected with a same sensor line.

For example, the driver line may be parallel to a gate line (G line) of the display substrate and located in a same film layer as the G line, such that the driver line, the G line, the first gate electrode 91 of the photodetection field effect transistor 9 and the second gate electrode 82 of the drive transistor 8 are located in a same film layer, that is to say, they may be prepared by using a same patterning process, so as to simplify the fabrication process. The sensor line may be parallel to a data line (a Vdata line) of the display substrate and located in a same film layer as the Vdata line, such that the sensor line, the Vdata line, the first source electrode 93 and the first drain electrode 94 of the photodetection field effect transistor 9, the second source electrode 83 and the second drain electrode 84 of the drive transistor 8 are located in a same film layer, that is to say, they may be prepared by using a same patterning process, so as to simplify the fabrication process.

It should be noted that, in the embodiment of the present disclosure, it is merely illustrated with a case where the photodetection field effect transistor 9 has a bottom gate structure, and the drive transistor 8 has a top gate structure as an example; in other embodiment of the present disclosure, the photodetection field effect transistor 9 may also have a top gate structure, and the drive transistor 8 may also have a bottom gate structure, which will not be limited in the embodiment of the present disclosure.

Moreover, in some embodiments of the present disclosure, it is illustrated with a case where the light-emitting device 3 is a light-emitting device of a bottom emitting type as an example; and in the embodiment of the present disclosure, the light-emitting device 3 is located on a side of the drive transistor 8 and the light sensing circuit 1 (which may specifically include the photodetection field effect transistor 9) that faces away from the base substrate 6. In other embodiment of the present disclosure, the light-emitting device 3 may also be a light-emitting device of a top emitting type; and a relative positional relationship between the light-emitting device 3, the drive transistor 8 and the light sensing circuit 1 may also be adaptively changed according to needs, which will not be limited in the embodiment of the present disclosure.

In some embodiments of the present disclosure, the first gate electrode 91 of the photodetection field effect transistor 9 serves as a control terminal of the photodetection field effect transistor 9, the first source electrode 93 serves as an input terminal of the photodetection field effect transistor 9, and the first drain electrode 94 serves as an output terminal of the photodetection field effect transistor 9; alternatively, the first source electrode 93 serves as the output terminal of the photodetection field effect transistor 9, and the first drain electrode 94 serves as the input terminal of the photodetection field effect transistor 9.

Based on the above-described display substrate, some embodiments of the present disclosure further provide a display panel, the display panel comprises the display substrate as described above, and the display panel may specifically be an OLED display panel.

Based on the above-described display panel, some embodiments of the present disclosure further provide a display device; the display device comprises the display panel as described above, and a computer product connected with the display panel; the computer product can execute one or more steps in the compensation method provided by the embodiments of the present disclosure, to compensate for aging of the light-emitting device in the display panel.

Based on the above description of the structure of the display substrate provided by the embodiment of the present disclosure, some embodiments of the present disclosure further provide a fabrication method of a display substrate, and referring to FIG. 12 to FIG. 16, the fabrication method comprises: fabricating at least one light sensing circuit on the base substrate 6, and fabricating a plurality of light-emitting devices 3. Fabrication of the light sensing circuit may be prior to fabrication of the light-emitting device 3.

For example, the step of fabricating the light sensing circuit includes fabricating a photodetection field effect transistor 9, and the fabricating a photodetection field effect transistor 9 includes: fabricating a first gate electrode 91, a first active layer 92, a first source electrode 93 and a first drain electrode 94.

The fabrication method of the display substrate, before the fabricating a plurality of light-emitting devices 3, may further comprise fabricating a plurality of drive transistors 8; for example, the fabricating a plurality of drive transistors 8 includes: fabricating a second gate electrode 82, a second active layer 81, a second source electrode 83 and a second drain electrode 84.

In the above embodiment, the first gate electrode 91 and the second gate electrode 82 may be fabricated by using a same step to simplify the fabrication process. The first source electrode 93 and the first drain electrode 94 are fabricated by using a same step as the second source electrode 83 and the second drain electrode 84, to simplify the fabrication process.

Hereinafter, the fabrication method of the display substrate according to the embodiment of the present disclosure will be exemplarily described with the structure of the display substrate shown in FIG. 12 as an example.

Step a: providing a base substrate 6, and forming a buffer layer 7 on the base substrate 6.

Step b: forming a semiconductor layer on a side of the buffer layer 7 that faces away from the base substrate 6, and patterning the semiconductor layer to form a second active layer 81.

Step c: forming a first gate insulating layer 10 on a side of the second active layer 81 that faces away from the base substrate 6.

Step d: forming a gate metal layer on a side of the first gate insulating layer 10 that faces away from the base substrate 6, patterning the gate metal layer, forming a second gate electrode 82, a first gate electrode 91, a G line (referring to FIG. 11) and a driver line (referring to FIG. 11); for example, the second gate electrode 82 is electrically connected with the G line, and the first gate electrode 91 is electrically connected with the driver line.

Step e: forming a second gate insulating layer 11 on a side of the gate metal layer that faces away from the base substrate 6, patterning the second gate insulating layer 11 and the first gate insulating layer 10, and forming a via hole exposing a surface of the second active layer 81 in the second gate insulating layer 11 and the first gate insulating layer 10.

Step f: forming a photosensitive semiconductor layer on a side of the second gate insulating layer 11 that faces away from the base substrate 6, and patterning the photosensitive semiconductor layer to form a first active layer 92.

Step g: forming a source/drain metal layer on the side of the second gate insulating layer 11 that faces away from the base substrate 6, patterning the source/drain metal layer, forming a second source electrode 83, a second drain electrode 84, a first source electrode 93, a first drain electrode 94, a Vdata line (referring to FIG. 11) and a sensor line (referring to FIG. 11); for example, the second source electrode 83 and the second drain electrode 84 are respectively electrically connected with the second active layer 81 through the via hole, the first source electrode 93 and the first drain electrode 94 are respectively electrically connected with the first active layer 92, the second source electrode 83 is electrically connected with the Vdata line, and the first drain electrode 94 is electrically connected with the sensor line.

Step h: forming a passivation layer 12 on a side of the source/drain metal layer that faces away from the base substrate 6, patterning the passivation layer 12, and forming a via hole that exposes a surface of the second drain electrode 84 in the passivation layer 12.

Step i: forming a first electrode layer on a side of the passivation layer 12 that faces away from the base substrate 6, and patterning the first electrode layer to form the first electrode 31; the first electrode 31 being electrically connected with the second drain electrode 84 through the via hole.

Step j: forming a pixel defining layer 13 on a side of the first electrode layer that faces away from the base substrate 6, patterning the pixel defining layer 13, and forming a hollow pattern for defining a pixel region in the pixel defining layer 13.

Step k: forming a light-emitting layer 32 in the hollow region of the pixel defining layer 13; the light-emitting layer 32 being in electrical contact with the first electrode 31.

Step l: forming a second electrode layer on a side of the light-emitting layer 32 that faces away from the base substrate 6, and patterning the second electrode layer to form a second electrode 33; the second electrode 33 being in electrical contact with the light-emitting layer 32.

Step m: forming a protective layer 14 on a side of the second electrode layer that faces away from the base substrate 6.

Several points below need to be explained:

(1) The drawings of the embodiments of the present disclosure relate only to the structures involved in the embodiments of the present disclosure, and normal designs may be referred to for other structures.

(2) In case of no conflict, the embodiments of the present disclosure and the features in the embodiments may be combined with each other to obtain a new embodiment.

The above description only provides exemplary embodiments, and is not intended to limit the scope of the present disclosure in any way. The scope of the present disclosure is defined by the appended claims.

The invention claimed is:

1. A compensation apparatus of a light-emitting device, comprising:
   a light sensing circuit, configured to output a first photo-generated current under a condition that the light-emitting device emits light, when the light-emitting device needs to be compensated;
   a compensation amount computing circuit, connected with the light sensing circuit, and configured to compute a compensation amount required to compensate the light-emitting device according to the first photo-generated current,
   wherein the light sensing circuit includes a photodetection field effect transistor, and the photodetection field effect transistor has a control terminal connected with an optical sensing control signal terminal, an input terminal connected with a power supply voltage signal terminal, and an output terminal connected with the compensation amount computing circuit, the light sensing circuit is further configured to output a ground state current under a condition that the light-emitting device does not emit light, when the light-emitting device needs to be compensated; and
   the compensation amount computing circuit includes:
   a photo-generated current calibration circuit, connected with the light sensing circuit, and configured to calibrate the first photo-generated current by using the ground state current, to obtain a second photo-generated current;
   a memory, stored with a $V_{data}$–$I_{ini}$ curve of the light-emitting device; where, $V_{data}$ is a data voltage when the light-emitting device is unaged, $I_{ini}$ is a photo-generated current generated by the light sensing circuit as sensing luminance under $V_{data}$ when the light-emitting device is unaged; and
   a computing unit, connected with the photo-generated current calibration circuit and the memory, and configured to look up a corresponding data voltage when $I_{ini}$ is equal to the second photo-generated current, and acquire a data voltage of the light-emitting device at a current moment, from the $V_{data}$–$I_{ini}$ curves stored in the memory, according to the second photo-generated current, and compute to obtain the compensation amount required to compensate for the data voltage of the light-emitting device,
   wherein the photo-generated current calibration circuit includes:
   a sample circuit, connected with the light sensing circuit, and configured to sample respectively with the ground state current and the first photo-generated current as input signals; and
   a calibrating sub-unit, connected with the sample circuit and the computing unit, and configured to perform calibration computation on a sampling result of the sample circuit, to obtain the second photo-generated current.

2. The compensation apparatus of the light-emitting device according to claim 1, wherein the sample circuit includes:
   an integrating capacitor, having a first terminal connected with the light sensing circuit, and a second terminal connected with the computing unit;
   an amplifier, having an inverting terminal connected with the light sensing circuit, and an output terminal connected with the computing unit;
   a first variable acquisition switch, having a control terminal connected with a sampling control signal terminal, an input terminal connected with the inverting terminal of the amplifier, and an output terminal connected with the output terminal of the amplifier;
   a second variable acquisition switch, having a control terminal connected with the sampling control signal terminal, an input terminal connected with the inverting terminal of the amplifier, and an output terminal connected with a non-inverting terminal of the amplifier;
   a storage capacitor, having a first terminal connected with the output terminal of the second variable acquisition switch, and a second terminal connected with a low potential signal terminal; and
   a reference resistor, electrically connected with the light sensing circuit and the inverting terminal of the amplifier.

3. The compensation apparatus of the light-emitting device according to claim 1, wherein the compensation apparatus further comprises:
   a processor, connected with the light sensing circuit and the compensation amount computing circuit, and configured to determine an opportunity to compensate the light-emitting device according to a setting rule, and correspondingly control the light sensing circuit and the compensation amount computing circuit to execute the compensation task;
   a data voltage generating circuit, connected with the processor, and configured to sum up the data voltage of the light-emitting device at the current moment and the compensation amount computed by the compensation amount computing circuit, to obtain the compensated data voltage and output.

4. A compensation method of a light-emitting device, for driving the compensation apparatus of the light-emitting device according to claim 1, wherein the compensation method comprises: when the light-emitting device in a display device needs to be compensated,
   turning on a light sensing circuit in the compensation apparatus, under a condition that the light-emitting device emits light, so that the light sensing circuit outputs a first photo-generated current;
   computing a compensation amount required to compensate the light-emitting device according to the first photo-generated current.

5. The compensation method of the light-emitting device according to claim 4, wherein before the turning on a light sensing circuit in the compensation apparatus, under a condition that the light-emitting device emits light, so that the light sensing circuit outputs a first photo-generated current, the method further comprises:
   turning on the light sensing circuit, under a condition that the light-emitting device does not emit light, so that the light sensing circuit outputs a ground state current;
   the computing a compensation amount required to compensate the light-emitting device according to the first photo-generated current, includes:
   calibrating the first photo-generated current by using the ground state current, to obtain a second photo-generated current $I_{ph}'$;
   looking up from a $V_{data}$–$I_{ini}$ curve of the light-emitting device a corresponding data voltage $V_{data}$ when $I_{ini}$ is equal to the second photo-generated current $I_{ph}'$, according to the second photo-generated current $I_{ph}'$; where, $V_{data}$ is the data voltage when the light-emitting device is unaged, and $I_{ini}$ is the photo-generated current generated by the light sensing circuit as sensing luminance under $V_{data}$ when the light-emitting device is unaged;

acquiring a data voltage $V_{data}{'}$ of the light-emitting device at the current moment; and computing to obtain a compensation amount $\Delta V_{data}$ required to compensate for the data voltage of the light-emitting device by using Formula (1) below:

$$\Delta V_{data}=|V_{data}{'}-V_{data}| \quad (1).$$

6. The compensation method of the light-emitting device according to claim 5, wherein the calibrating the first photo-generated current by using the ground state current, to obtain a second photo-generated current $I_{ph}{'}$ includes:

sampling with the ground state current as an input signal, and expressing an output signal $V_{out1}$, after the sampling by using Formula (2) below:

$$V_{out1} = \frac{1}{C}\int_0^t I_0(t)dt \quad (2)$$

where $I_0$ is the ground state current; C is a capacitance value of a storage capacitor in the compensation apparatus; and t is time for sampling with the ground state current $I_0$ as the input signal;

sampling with the first photo-generated current as an input signal, and expressing an output signal $V_{out2}$ after the sampling by using Formula (3) below:

$$V_{out2} = V_{out1} - \frac{1}{C}\int_0^t I_{ph}(t)dt \quad (3)$$

where $I_{ph}{'}$ is the first photo-generated current; C is a capacitance value of an integrating capacitor in the compensation apparatus, which is equal to the capacitance value of the storage capacitor in the compensation apparatus; t is time for sampling with the first photo-generated current $I_{ph}$ as the input signal, and is equal to the time for sampling with the ground state current $I_0$ as the input signal;

performing calibration computation by using Formula (4) below to obtain the second photo-generated current $I_{ph}{'}$:

$$\int_0^t I_{ph}{'}(t)dt = -V_{out2}C \quad (4)$$

7. The compensation method of the light-emitting device according to claim 5, wherein the compensation method further comprises: establishing the $V_{data}-I_{ini}$ curve of the light-emitting device, the establishing the $V_{data}-I_{ini}$ curve of the light-emitting device, includes:

performing an optical sensing test on the light sensing circuit, to acquire at least two groups of test data $(I_{ph,test}, P_{opt})$, where, $I_{ph,test}$ is the photo-generated current generated by the light sensing circuit as sensing optical power $P_{opt}$;

judging whether the at least two groups of test data $(I_{ph,test}, P_{opt})$ meet Formula (5) or meet Formula (6) below:

$$I_{ph,test}=A \cdot P_{opt} \quad (5)$$

where A is a first proportional coefficient;

$$I_{ph,test} = \frac{BkT}{q}\ln\left(1 + \frac{\eta q \lambda p_{opt}}{I_{pd}\, hc}\right) \quad (6)$$

where B is a second proportional coefficient; k is a Boltzmann constant; T is the absolute temperature; q is an electron charge; η is a photoelectric conversion quantum efficiency; hc/λ is photon energy; and $I_{pd}$ is a minority dark current;

if Formula (5) is met, performing function fitting once on $V_{data}$ and $I_{ini}$ in the $V_{data}-I_{ini}$ curve to be established, to establish the $V_{data}-I_{ini}$ curve;

if Formula (6) is met, performing exponential function fitting on $V_{data}$ and $I_{ini}$ in the $V_{data}-I_{ini}$ curve to be established, to establish the $V_{data}-I_{ini}$ curve;

wherein the establishing the $V_{data}-I_{ini}$ curve of the light-emitting device includes:

respectively establishing $V_{data}-I_{ini}$ curves with respect to light-emitting devices that emit light of different colors; respectively establishing $V_{data}-I_{ini}$ curves under different ambient light conditions with respect to a light-emitting device that emit light of a certain color;

before the looking up from a $V_{data}-I_{ini}$ curve of the light-emitting device a corresponding data voltage $V_{data}$ when $I_{ini}$ is equal to the second photo-generated current $I_{ph}{'}$, according to the second photo-generated current $I_{ph}{'}$, the compensation method further comprises: determining a color of light emitted by the light-emitting device, acquiring external ambient light luminance at the current moment, and selecting a $V_{data}-I_{ini}$ curve of the light-emitting device at the current moment according thereto.

8. The compensation method of the light-emitting device according to claim 4, wherein, after the computing a compensation amount required to compensate the light-emitting device according to the first photo-generated current, the compensation method further comprises:

summing up the data voltage of the light-emitting device at the current moment and the computed compensation amount, to obtain the compensated data voltage and output;

determining an opportunity to compensate the light-emitting device according to a setting rule, and compensate the light-emitting device at a corresponding opportunity;

wherein the setting rule is compensating the light-emitting device for every time interval.

9. A display device, comprising a light-emitting device, a pixel circuit, and the compensation apparatus of the light-emitting device according to claim 1;

wherein, the compensation apparatus is configured to supply the pixel circuit with a compensation amount required to compensate the light-emitting device.

10. A display substrate, comprising a light-emitting device and the compensation apparatus of the light-emitting device according to claim 1, wherein the light sensing circuit included in the compensation apparatus is provided corresponding to the light-emitting device and configured to output a first photo-generated current under a condition that a light-emitting device corresponding thereto emits light, when the light-emitting device corresponding thereto needs to be compensated.

11. The display substrate according to claim 10, wherein the light sensing circuit is located on a side of the light-emitting device corresponding thereto that faces the base substrate of the display substrate;

the light-emitting device sequentially includes: a first electrode, a light-emitting layer and a second electrode in a direction perpendicular to the base substrate and directing from the base substrate toward the light-emitting device;

the first electrode is light transmissive, and the second electrode is light reflective, wherein an orthogonal projection of the light sensing circuit on the base substrate is located within a range of an orthogonal projection of the light-emitting device corresponding to the light sensing circuit on the base substrate.

12. The display substrate according to claim 11, wherein the photodetection field effect transistor includes: a first gate electrode, a first active layer, a first source electrode and a first drain electrode;

the first electrode of the light-emitting device sequentially includes: a first transparent conductive layer, a metal conductive layer and a second transparent conductive layer;

the metal conductive layer has a via hole therein, the first transparent conductive layer and the second transparent conductive layer are in communication with each other through the via hole, and a position of the via hole corresponds to the region of the first active layer between the first source electrode and the first drain electrode.

13. The display substrate according to claim 12, wherein the display substrate further comprises a passivation layer located between the photodetection field effect and the light-emitting device; the passivation layer is provided therein with a microlens, a position of the microlens corresponds to the region of the first active layer between the first source electrode and the first drain electrode, to converge light incident through the via hole to the region of the first active layer between the first source electrode and the first drain electrode.

14. The display substrate according to claim 11, wherein the photodetection field effect transistor includes: a first gate electrode, a first active layer, a first source electrode and a first drain electrode;

the display substrate further comprises a drive transistor, and the drive transistor includes: a second gate electrode, a second active layer, a second source electrode and a second drain electrode;

the first gate electrode and the second gate electrode are located in a same film layer; the first source electrode and the first drain electrode are located in a same film layer as the second source electrode and the second drain electrode.

15. The display substrate according to claim 10, wherein the display substrate comprises a plurality of compensation regions, each compensation region in the plurality of compensation regions includes a plurality of light-emitting devices that emit light of different colors, and at least one light-emitting device of the plurality of light-emitting devices is correspondingly provided with the light sensing circuit.

16. A display device, comprising the display substrate according to claim 10.

* * * * *